(12) United States Patent
Kim

(10) Patent No.: US 8,179,938 B2
(45) Date of Patent: May 15, 2012

(54) LIGHT-EMITTING ELEMENT CAPABLE OF INCREASING AMOUNT OF LIGHT EMITTED, LIGHT-EMITTING DEVICE INCLUDING THE SAME, AND METHOD OF MANUFACTURING LIGHT-EMITTING ELEMENT AND LIGHT-EMITTING DEVICE

(75) Inventor: Yu-Sik Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 170 days.

(21) Appl. No.: 12/584,857

(22) Filed: Sep. 14, 2009

(65) Prior Publication Data
US 2010/0065881 A1    Mar. 18, 2010

(30) Foreign Application Priority Data
Sep. 16, 2008   (KR) .................. 10-2008-0090732

(51) Int. Cl.
*H01S 3/00* (2006.01)
(52) U.S. Cl. ............... 372/43.01; 438/29; 438/47
(58) Field of Classification Search .......... 438/21–47; 372/43.01–50.23
See application file for complete search history.

(56) References Cited

U.S. PATENT DOCUMENTS

| | | | |
|---|---|---|---|
| 7,190,001 B2 | 3/2007 | Taki | |
| 7,504,667 B2 | 3/2009 | Fujikura et al. | |
| 7,541,206 B2 | 6/2009 | Yoon et al. | |
| 2005/0056850 A1 | 3/2005 | Taki | |
| 2007/0018187 A1* | 1/2007 | Lee et al. ............... | 257/98 |
| 2011/0127571 A1* | 6/2011 | Khan et al. ............. | 257/103 |

FOREIGN PATENT DOCUMENTS

| | | |
|---|---|---|
| JP | 2005-93682 A | 4/2005 |
| JP | 2008108952 | 5/2008 |
| KR | 10-2006-0027134 A | 3/2006 |
| KR | 10-0643474 B1 | 10/2006 |
| KR | 1020060074390 | 10/2011 |

* cited by examiner

Primary Examiner — Richard A. Booth
(74) Attorney, Agent, or Firm — Onello & Mello, LLP

(57) ABSTRACT

A light-emitting element capable of increasing the amount of light emitted, a light-emitting device including the same, and a method of manufacturing the light-emitting element and the light-emitting device include a buffer layer having an uneven pattern formed thereon; a light-emitting structure including a first conductive pattern of a first conductivity type that is conformally formed along the buffer layer having the uneven pattern formed thereon, a light-emitting pattern that is conformally formed along the first conductive pattern, and a second conductive pattern of a second conductivity type that is formed on the light-emitting pattern; a first electrode electrically connected to the first conductive pattern; and a second electrode electrically connected to the second conductive pattern.

25 Claims, 20 Drawing Sheets

LIGHT-EMITTING ELEMENT CAPABLE OF INCREASING AMOUNT OF LIGHT EMITTED, LIGHT-EMITTING DEVICE INCLUDING THE SAME, AND METHOD OF MANUFACTURING LIGHT-EMITTING ELEMENT AND LIGHT-EMITTING DEVICE

CROSS-REFERENCE TO RELATED APPLICATION

This application claims priority from Korean Patent Application No. 10-2008-0090732 filed on Sep. 16, 2008 in the Korean Intellectual Property Office, the entire contents of which are incorporated herein by reference.

BACKGROUND OF THE INVENTION

1. Field of the Invention

The present invention relates to a light-emitting element, a light-emitting device including the light-emitting element, and a method of manufacturing the light-emitting element and the light-emitting device.

2. Description of the Related Art

Light-emitting elements, such as LEDs (light emitting diodes), emit light by coupling between electrons and holes. The light-emitting element has small power consumption, a long life span, a sufficiently small size to be provided in a small space, and high shock resistance.

For example, the light-emitting element includes a light-emitting pattern formed between an n-type GaN pattern and a p-type GaN pattern. In the light-emitting pattern, carriers (electrons) of the n-type GaN pattern and carriers (holes) of the p-type GaN pattern are coupled to each other to emit light.

The amount of light emitted from the light-emitting element is proportional to the size of the light-emitting pattern. That is, as the size of the light-emitting pattern is increased, the amount of light emitted from the light-emitting element is increased.

In the related art, a flat light-emitting pattern is formed on a substrate. Therefore, in order to increase the size of the light-emitting pattern, the overall size of the light-emitting device must be increased.

SUMMARY OF THE INVENTION

Aspects of the present invention provide a light-emitting element and a light-emitting device capable of increasing the amount of light emitted.

Aspects of the present invention also provide a method of manufacturing a light-emitting element and a light-emitting device capable of increasing the amount of light emitted.

The aspects, features and advantages of the present invention are not restricted to those set forth herein. The above and other aspects, features and advantages of the present invention will become more apparent to one of ordinary skill in the art to which the present invention pertains by referencing the detailed description given below.

According to an aspect of the present invention, there is provided a light-emitting element including: a buffer layer having an uneven pattern formed thereon; a light-emitting structure including a first conductive pattern of a first conductivity type that is conformally formed along the buffer layer having the uneven pattern formed thereon, a light-emitting pattern that is conformally formed along the first conductive pattern, and a second conductive pattern of a second conductivity type that is formed on the light-emitting pattern; a first electrode electrically connected to the first conductive pattern; and a second electrode electrically connected to the second conductive pattern.

In one embodiment, at least a portion of the cross-section of the uneven pattern is curved. In one embodiment, the uneven pattern has a semicircular shape in a cross-sectional view.

In one embodiment, the uneven pattern includes a plurality of periodic patterns.

In one embodiment, the uneven pattern is at least one of a dot pattern, a line pattern, and a mesh pattern.

In one embodiment, the side wall of the light-emitting structure is inclined.

In one embodiment, the width of the first conductive pattern is larger than that of the second conductive pattern and the light-emitting pattern such that a portion of the first conductive pattern protrudes from the second conductive pattern and the light-emitting pattern in a lateral direction. In one embodiment, the first electrode is formed on a protruding portion of the first conductive pattern, and the second electrode is formed on the upper surface and/or the side wall of the light-emitting structure.

In one embodiment, the second electrode is a reflecting electrode, and the second electrode is formed on the upper surface and the side wall of the light-emitting structure.

According to another aspect of the present invention, there is provided a light-emitting element including: a conductive substrate; a first electrode having a bowl shape and formed on the conductive substrate; a light-emitting structure including a first conductive pattern of a first conductivity type, a light-emitting pattern, and a second conductive pattern of a second conductivity type sequentially formed in the first electrode; a buffer layer formed on the light-emitting structure; and a second electrode formed on the buffer layer. An uneven pattern is formed on the buffer layer, the second conductive pattern is conformally formed along the buffer layer, and the light-emitting pattern is conformally formed along the second conductive pattern.

In one embodiment, at least a portion of the cross-section of the uneven pattern is curved.

In one embodiment, the buffer layer is formed such that a portion of the second conductive pattern is exposed, an ohmic layer is formed on the exposed region of the second conductive pattern, and the second electrode is formed on the ohmic layer.

In one embodiment, the bowl-shaped first electrode includes a protrusion that protrudes from the lower side thereof, the light-emitting structure is divided into two sides by the protrusion, and the second electrode is formed on one side of the light-emitting structure.

According to another aspect of the present invention, there is provided a light-emitting device including the light-emitting element according to the above aspect.

According to another aspect of the present invention, there is provided a method of manufacturing a light-emitting element, the method including: forming a buffer layer having an uneven pattern formed thereon on a substrate; forming a light-emitting structure including a first conductive pattern of a first conductivity type that is conformally formed along the buffer layer having the uneven pattern formed thereon, a light-emitting pattern that is conformally formed along the first conductive pattern, and a second conductive pattern of a second conductivity type that is formed on the light-emitting pattern; and forming a first electrode that is electrically connected to the first conductive pattern and a second electrode that is electrically connected to the second conductive pattern.

In one embodiment, at least a portion of the cross-section of the uneven pattern is curved.

In one embodiment, the uneven pattern includes a plurality of periodic patterns.

In one embodiment, the forming of the buffer layer having the uneven pattern formed thereon comprises: forming the buffer layer on the substrate; forming a mask pattern on the buffer layer; performing a heat treatment on the substrate having the mask pattern formed thereon such that at least a portion of the cross-section of the mask pattern is curved; and etching the buffer layer using the mask pattern subjected to the heat treatment to form the buffer layer having the uneven pattern formed thereon.

In one embodiment, the forming of the buffer layer having the uneven pattern formed thereon comprises: forming the buffer layer on the substrate; forming an insulating layer on the buffer layer; forming a mask pattern on the insulating layer; performing a heat treatment on the substrate having the mask pattern formed thereon such that at least a portion of the cross-section of the mask pattern is curved; etching the insulating layer using the mask pattern subjected to the heat treatment to form the insulating layer having an uneven pattern formed thereon; and etching the buffer layer using the insulating layer having the uneven pattern formed thereon to form the buffer layer having the uneven pattern formed thereon.

In one embodiment, the forming of the light-emitting structure comprises: conformally forming a first conductive layer of a first conductivity type along the buffer layer; conformally forming a light-emitting layer along the first conductive layer; forming a second conductive layer of a second conductivity type on the light-emitting layer; and patterning the second conductive layer, the light-emitting layer, and the first conductive layer to form the light-emitting structure including the second conductive pattern, the light-emitting pattern and the first conductive pattern, the width of the first conductive pattern being larger than that of the second conductive pattern and the light-emitting pattern such that the first conductive pattern protrudes from the second conductive pattern and the light-emitting pattern in a lateral direction. In one embodiment, the first electrode is formed on a protruding region of the first conductive pattern, and the second electrode is formed on the upper surface and/or the side wall of the light-emitting structure.

In one embodiment, the forming of the first electrode and the second electrode comprises: forming the second electrode on the light-emitting structure after the light-emitting structure is formed; bonding the substrate and a conductive substrate such that the second electrode is interposed between the substrate and the conductive substrate; removing the substrate; and forming the first electrode on the buffer layer. In one embodiment, the forming of the first electrode on the buffer layer comprises: etching a portion of the buffer layer such that the first conductive pattern is exposed; forming an ohmic layer on the exposed region of the first conductive pattern; and forming the first electrode on the ohmic layer. In one embodiment, the conductive substrate is larger than the substrate.

According to another aspect of the present invention, there is provided a method of manufacturing a light-emitting device using the method of manufacturing a light-emitting element according to the above aspect.

BRIEF DESCRIPTION OF THE DRAWINGS

The foregoing and other features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF THE EXEMPLARY EMBODIMENTS

Figure 1:
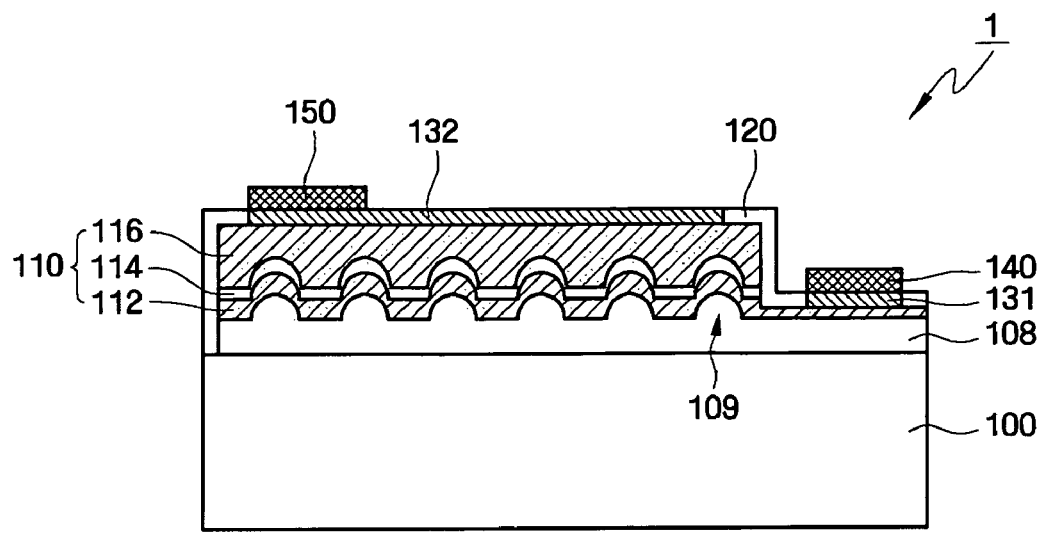
FIG. 1 is a cross-sectional view illustrating a light-emitting element according to a first embodiment of the present invention.

The present invention will now be described more fully with reference to the accompanying drawings, in which exemplary embodiments of the present invention are shown. The present invention may, however, be embodied in many different forms and should not be construed as being limited to the embodiments set forth herein. Rather, these embodiments are provided so that this description will be thorough and complete, and will fully convey the present invention to those skilled in the art. In the drawings, the size and relative sizes of layers and regions may be exaggerated for clarity.

It will be understood that when an element or layer is referred to as being "on" another element or layer, it can be directly on the other element or layer or intervening elements or layers may be present. In contrast, when an element is referred to as being "directly on" another element or layer, there are no intervening elements or layers present. As used herein, the term "and/or" includes any and all combinations of one or more of the associated listed items.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. In the specification, the same components are denoted by the same reference numerals.

Exemplary embodiments of the present invention are described herein with reference to cross-sectional illustrations that are schematic illustrations of idealized embodiments of the present invention. As such, variations from the shapes of the illustrations as a result, for example, of manufacturing techniques and/or tolerances, are to be expected. Thus, exemplary embodiments of the present invention should not be construed as limited to the particular shapes of regions illustrated herein but are to include deviations in shapes that result, for example, from manufacturing. Thus, the regions illustrated in the figures are schematic in nature and their shapes are not intended to illustrate the precise shape of a region and are not intended to limit the scope of the present invention.

Figure 2A:
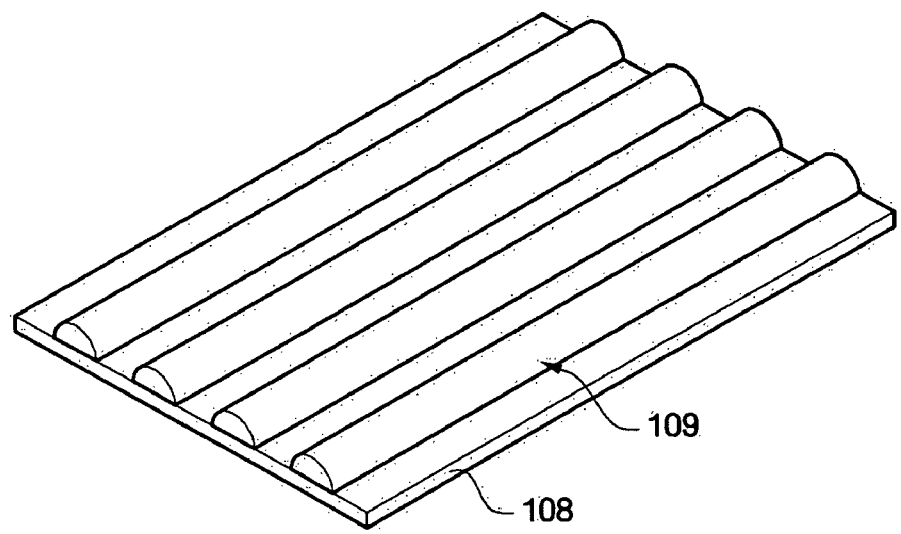
FIGS. 2A to 2C are diagrams illustrating various shapes of a buffer layer shown in FIG. 1.
Figure 2B:
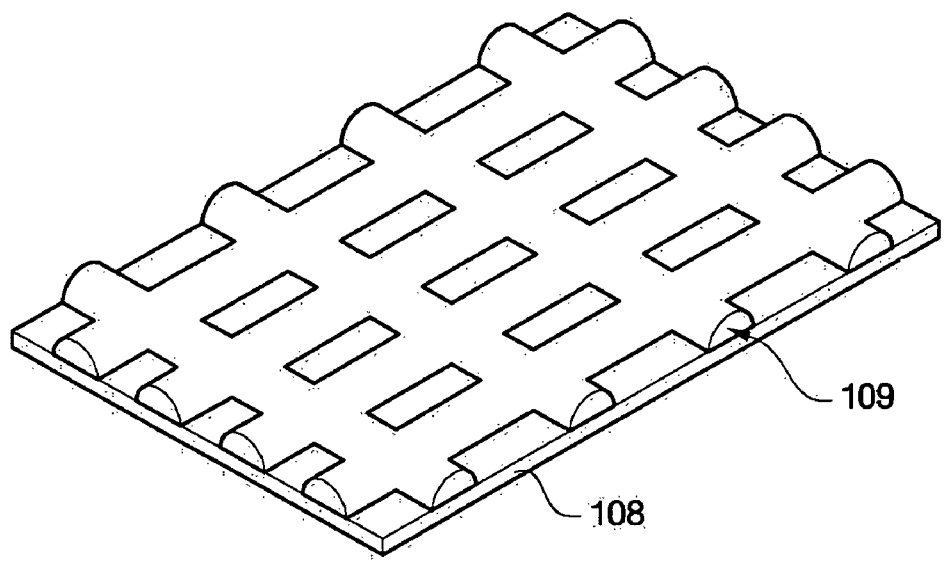
Figure 2C:
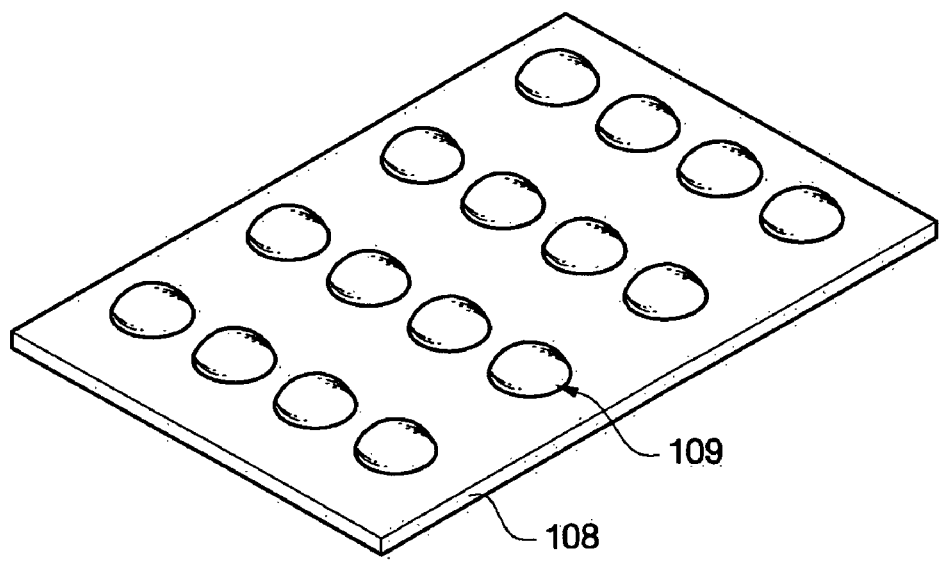
Figure 3:
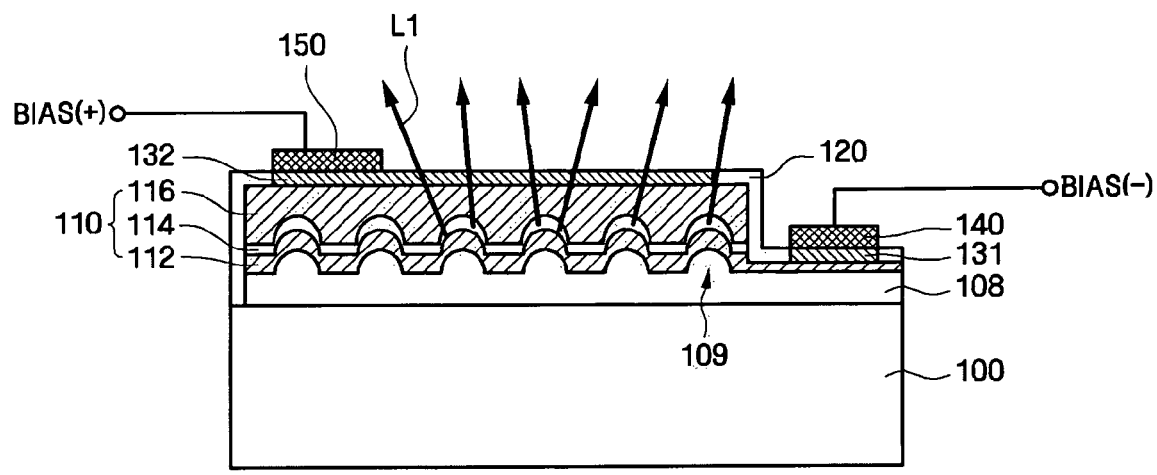
FIG. 3 is a diagram illustrating the operation of the light-emitting element according to the first embodiment of the present invention.

FIGS. 1 to 3 are diagrams illustrating a light-emitting element according to a first embodiment of the present invention. Specifically, FIG. 1 is a cross-sectional view illustrating the light-emitting element according to the first embodiment of the present invention, FIGS. 2A to 2C are diagrams illustrating various shapes of a buffer layer shown in FIG. 1, and FIG. 3 is a diagram illustrating the operation of the light-emitting element according to the first embodiment of the present invention. The light-emitting element according to the first embodiment of the present invention is a lateral type.

First, referring to FIG. 1, a light-emitting element 1 according to the first embodiment of the present invention includes a buffer layer 108 that is formed on a substrate 100 and has an uneven pattern 109 formed thereon, and a light-emitting structure 110 that is formed on the buffer layer 108. The light-emitting structure 110 includes a first conductive pattern 112 of a first conductivity type, a light-emitting pattern 114, and a second conductive pattern 116 of a second conductivity type formed in this order. A first electrode 140 is electrically connected to the first conductive pattern 112, and a second electrode 150 is electrically connected to the second conductive pattern 116.

Specifically, the buffer layer 108 is used as a seed layer for forming the first conductive pattern 112, the light-emitting pattern 114, and the second conductive pattern 116. The buffer layer 108 is also used to prevent a lattice mismatch between the substrate 100 and the light-emitting structure 110. Therefore, the buffer layer 108 improves the quality characteristics of the light-emitting structure 110.

The buffer layer 108 may be formed of any material suitable to serve as a seed layer. For example, the buffer layer 108 may be formed of $In_xAl_yGa_{1-x-y}N$ ($0 \leq x \leq 1$ and $0 \leq y \leq 1$), or $Si_xC_yN_{(1-x-y)}0$ ($0 \leq x \leq 1$ and $0 \leq y \leq 1$).

The buffer layer 108 determines the shapes of the first conductive pattern 112 and the light-emitting pattern 114. The uneven pattern 109 is formed on the buffer layer 108, and the shapes of the first conductive pattern 112 and the light-emitting pattern 114 may be adjusted depending on the shape of the uneven pattern 109. This is because the first conductive pattern 112 and the light-emitting pattern 114 are conformally formed along the buffer layer 108 having the uneven pattern 109 formed thereon, which will be described below.

The uneven pattern 109 may include a plurality of patterns, and the plurality of patterns may be periodically repeated. For example, the uneven pattern 109 may be a line pattern shown in FIG. 2A, a mesh pattern shown in FIG. 2B, or a dot pattern shown in FIG. 2C. However, the patterns shown in FIGS. 2A to 2C are illustrative, but not limitative.

At least a portion of the cross-section of the uneven pattern 109 may have a curvature. For example, the uneven pattern 109 may have a semicircular shape, as shown in FIG. 2C.

The buffer layer 108 may be grown on the substrate 100 by, for example, MOCVD (metal organic chemical vapor deposition), liquid phase epitaxy, hydride vapor phase epitaxy, molecular beam epitaxy, or MOVPE (metal organic vapor phase epitaxy).

The light-emitting structure 110 includes the first conductive pattern 112 of the first conductivity type, the light-emitting pattern 114, and the second conductive pattern 116 of the second conductivity type formed in this order.

The first conductive pattern 112, the light-emitting pattern 114, and the second conductive pattern 116 may include $In_xAl_yGa_{(1-x-y)}N$ ($0 \leq x \leq 1$ and $0 \leq y \leq 1$) (that is, various kinds of materials including GaN). That is, the first conductive pattern 112, the light-emitting pattern 114, the second conductive pattern 116 may be formed of, for example, AlGaN or InGaN.

Next, the layers will be described in detail. The first conductive pattern 112 may be a first conductivity type (for example, an n type), and the second conductive pattern 116 may be a second conductivity type (for example, a p type). Alternatively, the first conductive pattern 112 may be the second conductivity type (p type), and the second conductive pattern 116 may be the first conductivity type (n type).

In the light-emitting pattern 114, carriers (for example, electrons) of the first conductive pattern 112 are coupled to carries (for example, holes) of the second conductive pattern 116 to emit light. Although not specifically shown in the drawings, the light-emitting pattern 114 may include a well layer and a barrier layer. Since the well layer has a band gap that is smaller than that of the barrier layer, the carriers (electrons and holes) are collected and coupled in the well layer. The light-emitting layer 114 may be classified as a single quantum well (SQW) structure or a multiple quantum well (MQW) structure according to the number of well layers. The single quantum well structure includes one well layer, and the multiple quantum well structure includes multiple well layers. In order to adjust emission characteristics, at least one of the well layer and the barrier layer may be doped with at least one of B, P, Si, Mg, Zn, Se, and Al.

In particular, in the light-emitting element 1 according to the first embodiment of the present invention, the first conductive pattern 112 may be conformally formed along the buffer layer 108 having the uneven pattern 109 formed thereon, and the light-emitting pattern 114 may be conformally formed along the first conductive pattern 112. Therefore, the light-emitting pattern 114 is not flat, but is curved.

Assuming that the substrates 100 having the same size are used, the area of a flat light-emitting pattern is larger than that of the curved light-emitting pattern 114. Since the amount of light emitted from a light-emitting element is proportional to the size of the light-emitting pattern, the amount of light emitted from the curved light-emitting pattern 114 is more than that of light emitted from the flat light-emitting pattern. That is, the light-emitting element 1 according to the first embodiment of the present invention can increase the emission amount of light, without increasing the size of the substrate 100.

Various methods may be used to curve the light-emitting pattern 114. However, a method of forming the uneven pattern 109 on the buffer layer 108 and conformally forming the first conductive pattern 112 and the light-emitting pattern 114 along the buffer layer 108 according to this embodiment of the present invention is more preferable than the following methods in terms of emission characteristics.

Specifically, an uneven pattern may be formed on the first conductive pattern, and the light-emitting pattern may be conformally formed along the first conductive pattern having the uneven pattern formed thereon. However, since a material that is generally used to form the first conductive pattern (for example, GaN) is not easily removed by wet etching, the uneven pattern needs to be formed on the first conductive pattern by dry etching. Since the dry etching causes various defects in the first conductive pattern, many defects may occur in the light-emitting pattern grown by using the first conductive pattern. The defective light-emitting pattern has bad emission characteristics.

As another method, the uneven pattern may be directly formed on the light-emitting pattern. Since a material that is generally used to form the light-emitting pattern (for example, a multi-layer formed by alternately laminating InGaN and GaN layers) is similar to that used to form the first conductive pattern, dry etching is used to form the uneven pattern on the light-emitting pattern. Therefore, this method also causes many defects in the light-emitting pattern.

In contrast, in this embodiment, as described above, since the buffer layer 108 serves as a seed layer or it is used to prevent the lattice mismatch between the substrate 100 and the light-emitting structure 110, defects occurring in the buffer layer 108 do not have a great effect on the emission characteristics. Therefore, it is more preferable to perform dry etching on the buffer layer 108 to form the uneven pattern 109 on the buffer layer 108 than to form the uneven pattern on the layers other than the buffer layer.

As shown in FIG. 1, the upper surface of the second conductive pattern 116 may be flat, but the present invention is not limited thereto. Since the second conductive pattern 116 has a very small thickness (for example, a thickness of 120 nm or less), the second conductive pattern 116 may be formed in an uneven pattern that is similar to the uneven pattern 109 formed on the buffer layer 108.

As shown in FIG. 1, since the width of the first conductive pattern 112 is larger than that of the second conductive pattern 116 and the light-emitting pattern 114, a portion of the first conductive pattern 112 may protrude in the lateral direction (that is, the first conductive pattern 112 may protrude from the second conductive pattern 116 or the light-emitting pattern 114).

An insulating layer 120 is conformally formed along the profile of the light-emitting structure 110, and is patterned such that a portion of the first conductive pattern 112 and a portion of the second conductive pattern 116 are exposed. The insulating layer 120 may include a silicon oxide film, a silicon nitride film, an aluminum oxide film, or an aluminum nitride film. The insulating layer 120 may be formed by, for example, PECVD (plasma enhanced chemical vapor deposition), thermal oxidation, electron beam deposition, or sputtering.

A first ohmic layer 131 and a first electrode 140 may be formed on the first conductive pattern 112 exposed from the insulating layer 120, and a second ohmic layer 132 and a second electrode 150 may be formed on the second conductive pattern 116 exposed from the insulating layer 120. That is, the first electrode 140 may be formed in a protruding region of the first conductive pattern 112, and the second electrode 150 may be formed on the upper surface of the light-emitting structure 110.

Each of the first ohmic layer 131 and the second ohmic layer 132 may include at least one of ITO (indium tin oxide), zinc (Zn), zinc oxide (ZnO), silver (Ag), tin (Ti), aluminum (Al), gold (Au), nickel (Ni), indium oxide ($In_2O_3$), tin oxide ($SnO_2$), copper (Cu), tungsten (W), and platinum (Pt). Each of the first electrode 140 and the second electrode 150 may include at least one of indium tin oxide (ITO), copper (Cu), nickel (Ni), chrome (Cr), gold (Au), titanium (Ti), platinum (Pt), aluminum (Al), vanadium (V), tungsten (W), molybdenum (Mo), and silver (Ag).

FIG. 1 shows a lateral-type light-emitting element 1. Therefore, light may be emitted from the light-emitting structure 110 to the upper side of FIG. 1 (that is, to the second conductive pattern 116). In order to ensure an optical path, the second electrode 150 is formed at one side of the second conductive pattern 116. Of course, the second electrode 150 may have the shape shown in FIG. 1 as long as the second electrode 150 has high transparency and does not shield light.

The substrate 100 may be formed of any material as long as the material can grow the first conductive pattern 112, the light-emitting pattern 114, and the second conductive pattern 116. For example, the substrate 100 may be an insulating substrate made of, for example, sapphire ($Al_2O_3$) or zinc oxide (ZnO), or a conductive substrate made of, for example, silicon (Si), silicon carbide (SiC), or gallium nitride (GaN).

Although not shown in the drawings, a texture shape may be formed on the surface of the second conductive pattern 116. The texture shape makes it possible to increase the amount of light emitted from the light-emitting structure 110, which results in an improvement in light emission efficiency.

Next, the operation of the light-emitting element 1 according to the first embodiment of the present invention will be described with reference to FIG. 3.

When the first conductive pattern 112 is an n type and the second conductive pattern 116 is a p type, a first bias BIAS(−) is applied to the first conductive pattern 112 through the first electrode 140 and the first ohmic layer 131, and a second bias BIAS(+) is applied to the second conductive pattern 116 through the second electrode 150 and the second ohmic layer 132. On the other hand, when the second conductive pattern 116 is an n type and the first conductive pattern 112 is a p type, the second bias BIAS(+) is applied to the first conductive pattern 112 through the first electrode 140 and the first ohmic layer 131, and the first bias BIAS(−) is applied to the second conductive pattern 116 through the second electrode 150 and the second ohmic layer 132.

In this way, a forward bias is applied to the light-emitting structure 110. The forward bias causes the light-emitting pattern 114 to emit a light component L1 to the outside.

Figure 4:
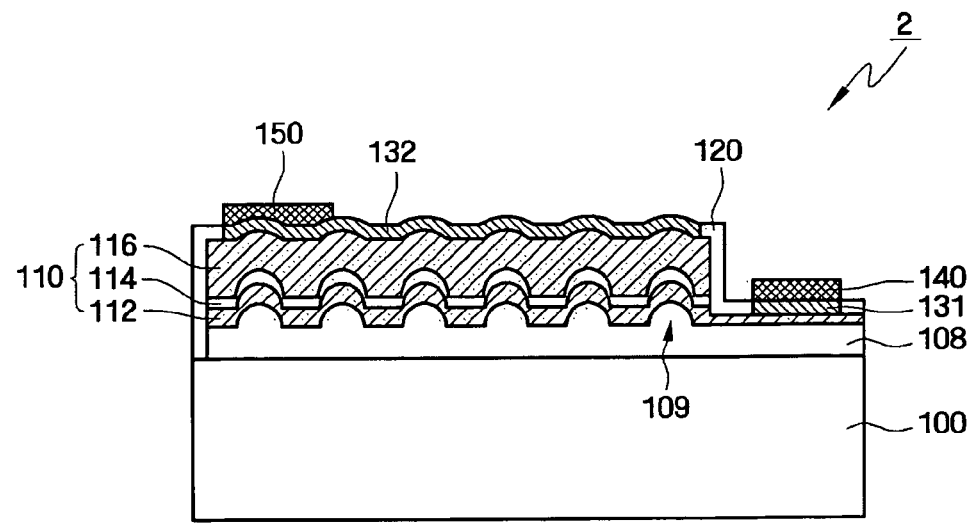
FIG. 4 is a diagram illustrating a light-emitting element according to a second embodiment of the present invention.

FIG. 4 is a diagram illustrating a light-emitting element according to a second embodiment of the present invention. The light-emitting element according to the second embodiment of the present invention is a lateral type.

Referring to FIG. 4, a light-emitting element 2 according to the second embodiment of the present invention differs from that according to the first embodiment in that the second conductive pattern 116 has an uneven upper surface and is conformally formed along the light-emitting pattern 114.

When the second conductive pattern 116 is an uneven surface, light can be emitted from the light-emitting pattern 114 to the outside without being confined in the light-emitting structure 110.

As shown in FIG. 4, the second ohmic layer 132 may be conformally formed along the second conductive pattern 116, and the upper surface of the second ohmic layer 132 may be flat. In addition, a region of the second ohmic layer 132 in which the second electrode 150 will be formed may be flat.

Figure 5:
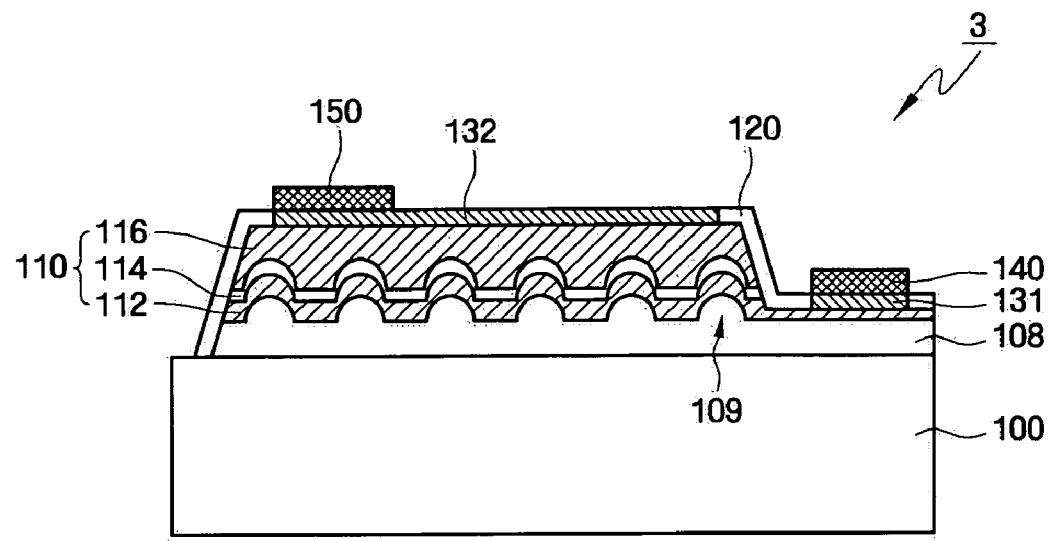
FIG. 5 is a diagram illustrating a light-emitting element according to a third embodiment of the present invention.

FIG. 5 is a diagram illustrating a light-emitting element according to a third embodiment of the present invention. The light-emitting element according to the third embodiment of the present invention is a lateral type.

Referring to FIG. 5, a light-emitting element 3 according to the third embodiment of the present invention differs from that according to the first embodiment in that the side wall of the light-emitting structure 110 is inclined. When the side wall of the light-emitting structure 110 is inclined, light can be emitted from the light-emitting pattern 114 to the outside without being confined in the light-emitting structure 110. That is, light emission efficiency is improved. In particular, the amount of light emitted from the side wall of the light-emitting structure 110 is increased.

Figure 6:
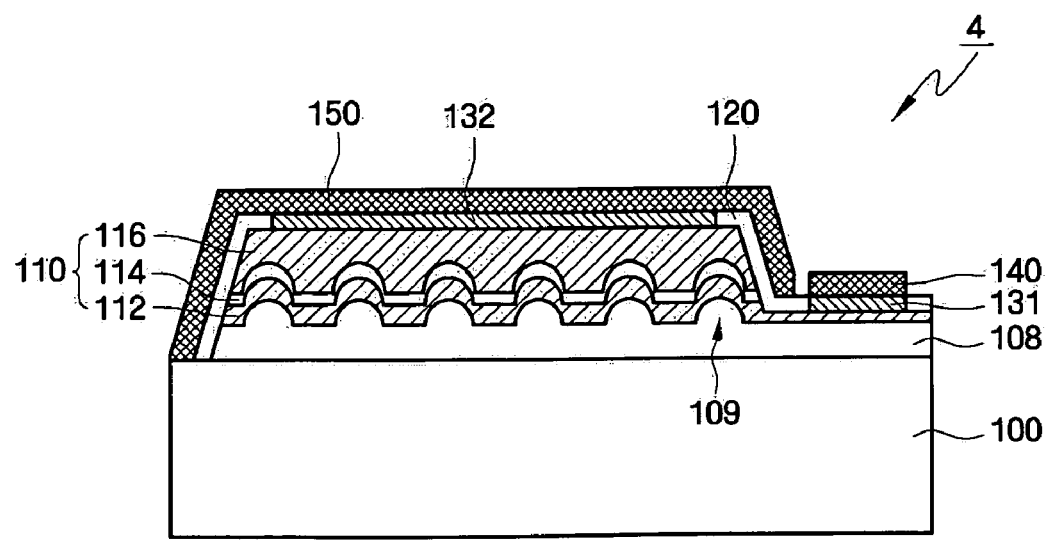
FIG. 6 is a diagram illustrating a light-emitting element according to a fourth embodiment of the present invention.
Figure 7:
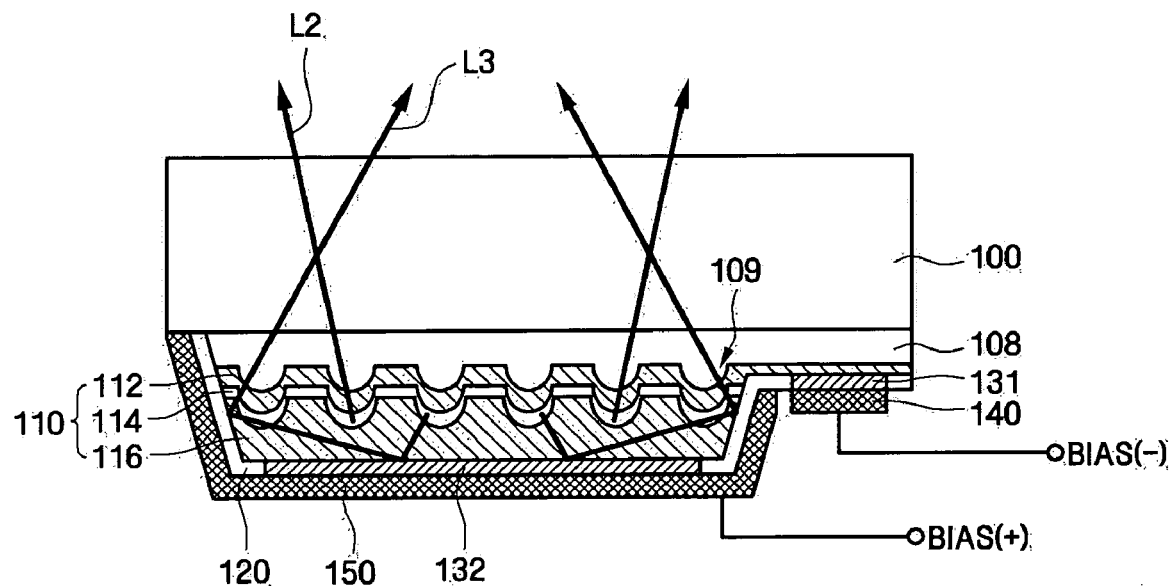
FIG. 7 is a diagram illustrating the operation of the light-emitting element according to the fourth embodiment of the present invention.

FIG. 6 is a diagram illustrating a light-emitting element according to a fourth embodiment of the present invention. FIG. 7 is a diagram illustrating the operation of the light-emitting element according to the fourth embodiment of the present invention. The light-emitting element according to the fourth embodiment of the present invention is a flip chip type.

Referring to FIG. 6, a light-emitting element 4 according to the fourth embodiment of the present invention includes a buffer layer 108 having an uneven pattern 109 formed thereon and a light-emitting structure 110 that is formed on the buffer layer 108 such that the side wall thereof is inclined. A second electrode 150 may be a reflecting electrode (which is made of a material having high reflectance, such as silver (Ag) or aluminum (Al)), and the second electrode 150 may be formed on the upper surface and the side wall of the light-emitting structure 110.

Therefore, as shown in FIG. 7, a light component L2 of the light components L2 and L3 generated from the light-emitting structure 110 is directly emitted to the substrate 100, and the light component L3 is reflected from the second electrode 150 to the substrate 100. As such, the second electrode 150 formed on the side wall of the light-emitting structure 110 can increase the light emission efficiency of the flip chip-type light-emitting element 4.

Although not shown in the drawings, in the flip chip-type light-emitting element, the side wall of the light-emitting structure may not be inclined, and the second electrode may be formed on only the upper surface of the light-emitting structure.

Figure 8:
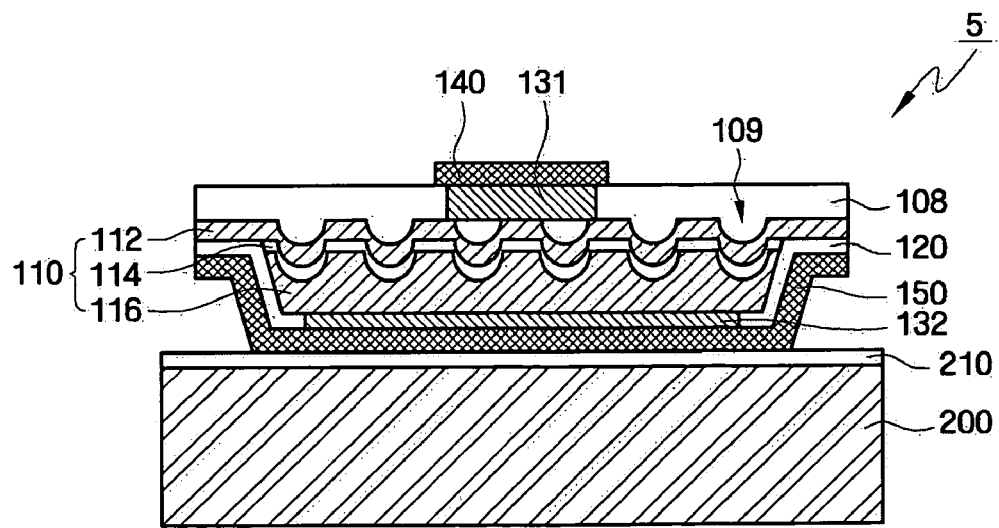
FIG. 8 is a diagram illustrating a light-emitting element according to a fifth embodiment of the present invention.

FIG. 8 is a diagram illustrating a light-emitting element according to a fifth embodiment of the present invention. The light-emitting element according to the fifth embodiment of the present invention is a vertical type.

Referring to FIG. 8, a light-emitting element 5 according to the fifth embodiment of the present invention includes a conductive substrate 200, a bowl-shaped second electrode 150 that is formed on the conductive substrate 200, a light-emitting structure 110 formed in the second electrode 150, a buffer layer 108 formed on the light-emitting structure 110, and a first electrode 140 formed on the buffer layer 108. In particular, the uneven pattern 109 may be formed on the buffer layer 108, and the second conductive pattern 116 may be conformally formed along the buffer layer 108. In addition, the light-emitting pattern 114 may be conformally formed along the second conductive pattern 116.

The second electrode 150 may be formed of a material having high reflectance, such as silver (Ag) or aluminum (Al). The reason why the second electrode 150 is formed of a material having high reflectance is to reflect light emitted from the light-emitting structure 110 from the second electrode 150 to the outside.

The second electrode 150 and the second conductive pattern 116 are electrically connected to each other by the second ohmic layer 132.

Even though the second electrode 150 is formed on the side wall of the light-emitting structure 110 (even though the second electrode 150 surrounds the light-emitting structure 110), the second electrode 150 does not electrically connect the first conductive pattern 112 and the second conductive pattern 116 (that is, the patterns are not short-circuited) since the insulating layer 120 is formed between the second electrode 150 and the light-emitting structure 110. That is, the insulating layer 120 can prevent a leakage current.

The buffer layer 108 is formed such that a portion of the first conductive pattern 112 is exposed, and the first ohmic layer 131 is formed on the exposed region of the first conductive pattern 112. The first electrode 140 is formed on the first ohmic layer 131. That is, the first electrode 140 and the first conductive pattern 112 are electrically connected to each other by the first ohmic layer 131.

Although not shown in the drawings, after the entire buffer layer 108 is removed, the first ohmic layer 131 and the first electrode 140 may be formed on the first conductive pattern 112.

The buffer layer 108 may have a resistance that is larger than that of the first conductive pattern 112. The reason is that the first conductive pattern 112 is doped with a first conductive dopant, but the buffer layer 108 is undoped. The first electrode 140 and the first conductive pattern 112 may be electrically connected to each other by the first ohmic layer 131 in order to transmit a voltage applied to the first electrode 140 to the first conductive pattern 112 with a small voltage drop.

The conductive substrate 200 may be formed of a conductive material. For example, the conductive substrate 200 may be formed of at least one of silicon, strained silicon (Si), silicon alloy, Si—Al, SOI (silicon-on-insulator), silicon carbide (SiC), silicon germanium (SiGe), silicon germanium carbide (SiGeC), germanium, germanium alloy, gallium arsenide (GaAs), indium arsenide (InAs), a group III-V semiconductor, and a group II-VI semiconductor.

An adhesive material layer 210 is formed between the substrate 200 and the second electrode 150. The adhesive material layer 210 is used to bond the substrate 200 and the second electrode 150. The adhesive material layer 210 may be formed of a conductive material. For example, the adhesive material layer 210 may be a metal layer. The metal layer may include at least one of Au, Ag, Pt, Ni, Cu, Sn, Al, Pb, Cr, and Ti. That is, the metal layer may be a single layer formed of Au, Ag, Pt, Ni, Cu, Sn, Al, Pb, Cr, or Ti, a laminate thereof, or a composition thereof. For example, the metal layer may be an Au layer, an Au—Sn layer, or a multilayer formed by alternately laminating Au and Sn layers. The adhesive material layer 210 may be formed of a material having a reflectance that is lower than that of the second electrode 150.

In the drawings, the adhesive material layer 210 is shown to be formed along the profile of the substrate 200, but the present invention is not limited thereto. For example, the adhesive material layer 210 may be conformally formed on the second electrode 150 along the profile of the second electrode 150.

Although not shown in the drawings, a barrier layer may be formed between the second electrode 150 and the intermediate material layer 210. The barrier layer prevents the damage of the second electrode 150 that reflects light. The barrier layer may be a single layer made of Pt, Ni, Cu, Al, Cr, Ti, or W, a laminate thereof, or a composition thereof. For example, the barrier layer may be a multilayer formed by alternately laminating TiW and Pt layers.

Figure 9:
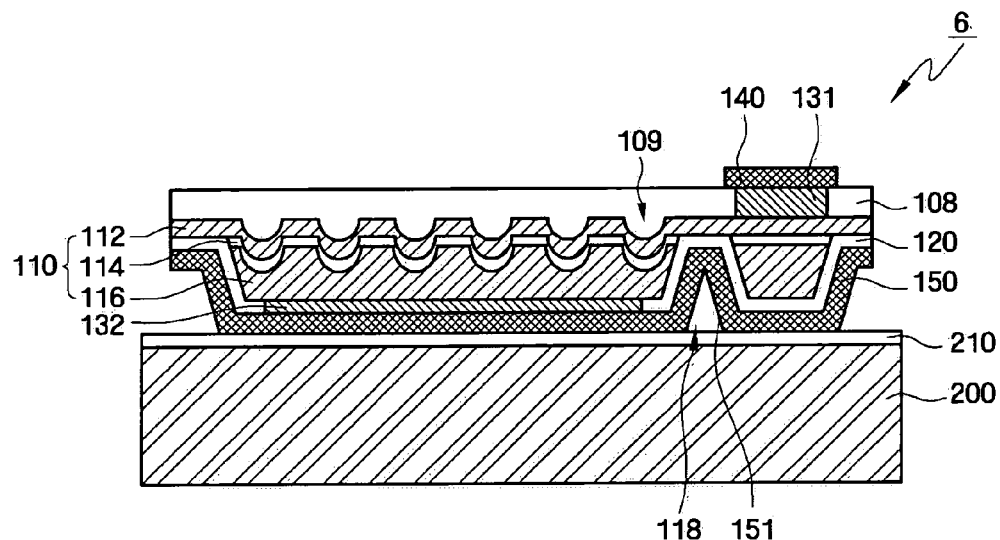
FIG. 9 is a diagram illustrating a light-emitting element according to a sixth embodiment of the present invention.

FIG. 9 is a diagram illustrating a light-emitting element according to a sixth embodiment of the present invention.

Referring to FIG. 9, a light-emitting element 6 according to the sixth embodiment of the present invention differs from that according to the fifth embodiment in that a protrusion 151 is formed on the bowl-shaped second electrode 150 and a groove 118 is formed in the light-emitting structure 110 provided in the second electrode 150 so as to correspond to the protrusion.

For example, one side of the light-emitting structure 110 is the right side of the protrusion 151 or the groove 118, and the other side thereof is the left side of the protrusion 151 or the groove 118. A pad pattern of the first electrode 140 may be formed on the one side of the light-emitting structure 110.

Next, light-emitting devices manufactured by using the light-emitting elements 1 to 6 will be described. For convenience of description, a light-emitting device using the light-emitting element 1 according to the first embodiment of the present invention is shown in the drawings, but the scope of the present invention is not limited thereto. It should be understood by those skilled in the art that the light-emitting device can be manufactured by using any of the light-emitting elements 1 to 5.

Figure 10:
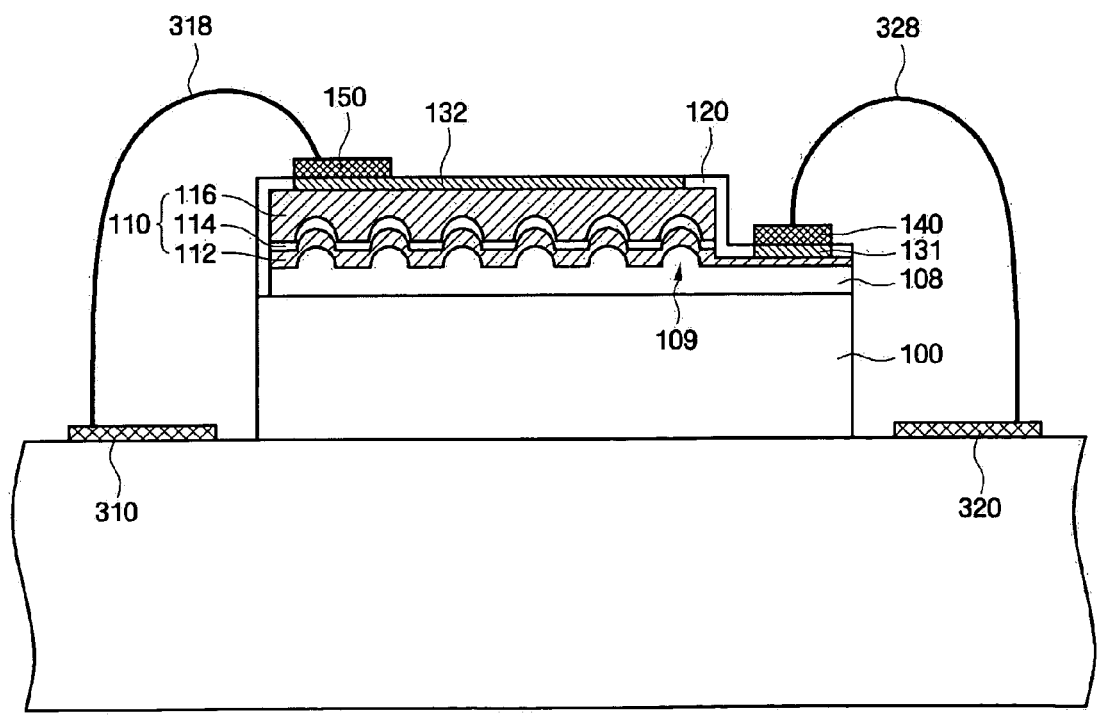
FIGS. 10 and 11 are diagrams illustrating a light-emitting device according to the first embodiment of the present invention.
Figure 11:
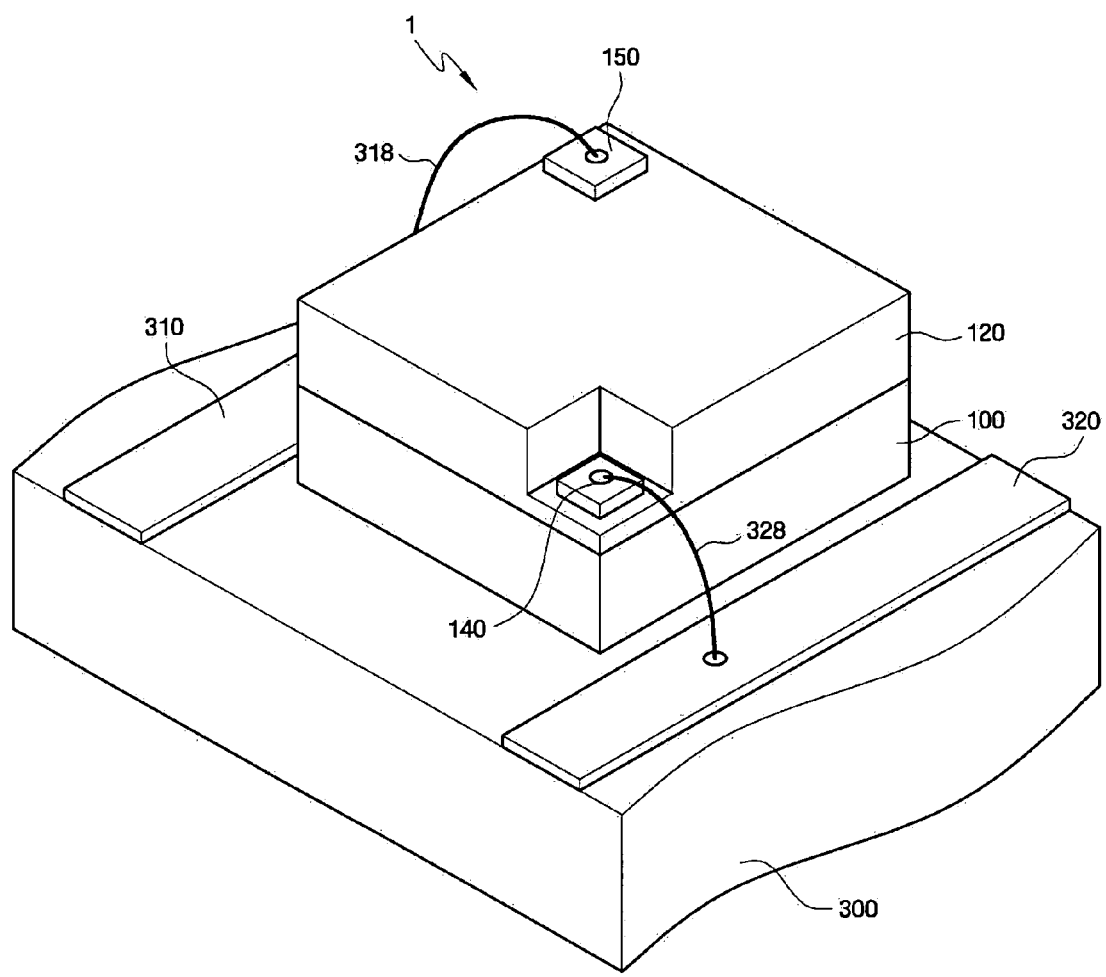

FIGS. 10 and 11 are diagrams illustrating a light-emitting device according to the first embodiment of the present invention.

Referring to FIGS. 10 and 11, the light-emitting device according to the first embodiment of the present invention includes a circuit board 300 and the light-emitting element 1 formed on the circuit board 300.

The circuit board 300 includes a first wiring line 310 and a second wiring line 320 that are electrically isolated from each other. The first wiring line 310 and the second wiring line 320 are provided on one surface of the circuit board 300.

The first wiring line 310 is electrically connected to the second electrode 150 of the light-emitting element 1, and the second wiring line 320 is electrically connected to the first electrode 140 of the light-emitting element 1. Specifically, the first wiring line 310 and the second electrode 150 may be connected to each other by a wire 318, and the second wiring line 320 and the first electrode 140 may be connected to each other by a wire 328. That is, the wiring lines and the electrodes may be connected to each other by wire bonding.

Figure 12:
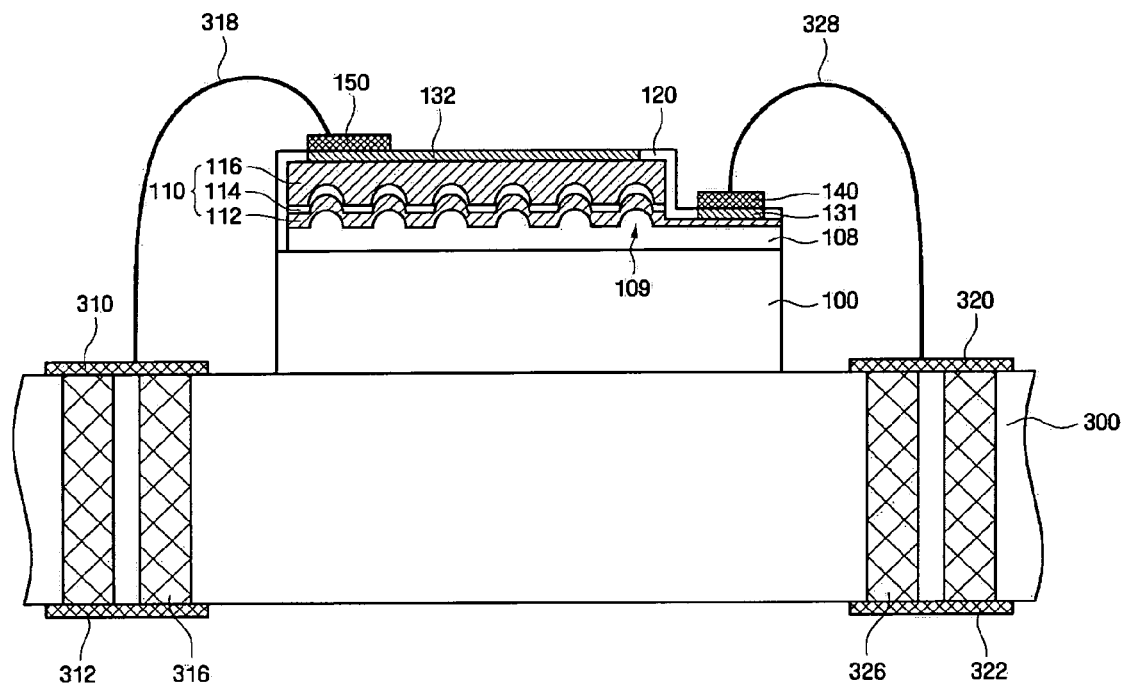
FIG. 12 is a diagram illustrating a light-emitting device according to the second embodiment of the present invention.

FIG. 12 is a diagram illustrating a light-emitting device according to the second embodiment of the present invention.

Referring to FIG. 12, the light-emitting device according to the second embodiment of the present invention differs from that according to the first embodiment in that the circuit board 300 includes through vias 316 and 326.

Specifically, the first wiring line 310 and the second wiring line 320 are formed on one surface of the circuit board 300 so as to be electrically insulated from each other, and a third wiring line 312 and a fourth wiring line 322 are formed on the other surface of the circuit board 300 so as to be electrically insulated from each other. The first wiring line 310 and the third wiring line 312 are connected to each other by the first through via 316, and the second wiring line 320 and the fourth wiring line 322 are connected to each other by the second through via 326.

Figure 13:
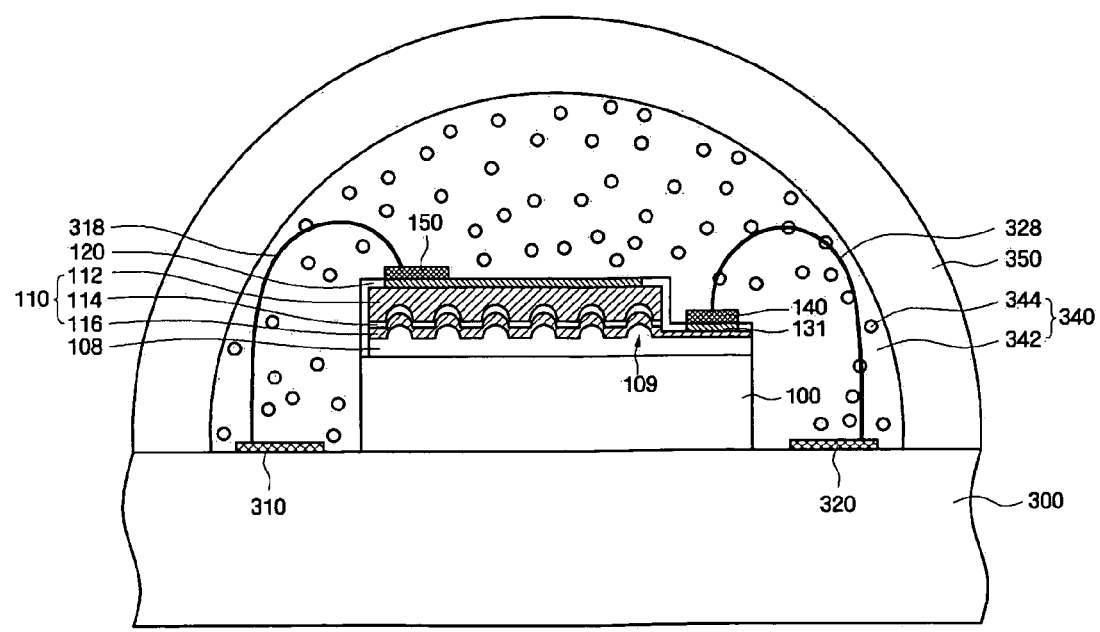
FIG. 13 is a diagram illustrating a light-emitting device according to the third embodiment of the present invention.

FIG. 13 is a diagram illustrating a light-emitting device according to the third embodiment of the present invention.

Referring to FIG. 13, the light-emitting device according to the third embodiment of the present invention differs from that according to the first embodiment in that it includes a phosphor layer 340 that surrounds the light-emitting element 1 and a second transparent resin 350 that surrounds the phosphor layer 340.

The phosphor layer 340 may be a mixture of a first transparent resin 342 and a phosphor 344. The phosphor 344 dispersed in the phosphor layer 340 absorbs light emitted from the light-emitting element 1 and converts it into light with a different wavelength. Therefore, as the phosphor is dispersed well, the emission characteristics are improved. As a result, the wavelength conversion efficiency and the color mixture effect of the phosphor 344 can be improved.

For example, the phosphor layer 340 may be formed in the light-emitting device in order to emit white light. When the light-emitting element 1 emits blue light, the phosphor 344 may include a yellow phosphor, and it may also include a red phosphor in order to improve a color rendering index (CRI) characteristic. When the light-emitting element 1 emits UV light, the phosphor 344 may include all of the red, green, and blue phosphors.

The first transparent resin 342 is not particularly limited as long as it can stably disperse the phosphor 344. For example, the first transparent resin 342 may be, for example, an epoxy resin, a silicon resin, a hard silicon resin, a modified silicon resin, a urethane resin, an oxetane resin, an acrylic resin, a polycarbonate resin, or a polyimide resin.

The phosphor 344 is not particularly limited as long as it can absorb light from the light-emitting structure 110 and convert it into light having a different wavelength. For example, the phosphor is preferably at least one selected from the following materials: a nitride-based phosphor or an oxynitride-based phosphor that is mainly activated by a lanthanoid element, such as Eu or Ce; an alkaline earth element halogen apatite phosphor, an alkaline earth metal element boride halogen phosphor, an alkaline earth metal element aluminate phosphor, alkaline earth element silicate, alkaline earth element sulfide, alkali earth element thiogallate, alkaline earth element silicon nitride, and germanate that are mainly activated by a lanthanoid element, such as Eu, or a transition metal element, such as Mn; rare earth aluminate and rare earth silicate that are mainly activated by a lanthanoid element, such as Ce; and an organic compound and an organic complex that are mainly activated by a lanthanoid element, such as Eu. Specifically, the following phosphors may be used, but the present invention is not limited to thereto.

The nitride-based phosphors that are mainly activated by a lanthanoid element, such as Eu or Ce include $M_2Si_5N_8$:Eu (M is at least one element selected from the group consisting of Sr, Ca, Ba, Mg, and Zn). In addition to $M_2Si_5N_8$:Eu, $MSi_7N_{10}$:Eu, $M_{1.8}Si_5O_{0.2}N_8$:Eu, $M_{0.9}Si_7O_{0.1}N_{10}$:Eu (M is at least one element selected from the group consisting of Sr, Ca, Ba, Mg, and Zn) are also included.

The oxynitride-based phosphors mainly activated by a lanthanoid element, such as Eu or Ce, include $MSi_2O_2N_2$:Eu (M is at least one element selected from the group consisting of Sr, Ca, Ba, Mg, and Zn).

The alkaline earth element halogen apatite phosphors mainly activated by a lanthanoid element, such as Eu, or a transition metal element, such as Mn, include $M_5(PO_4)_3X$:R (M is at least one element selected from the group consisting of Sr, Ca, Ba, Mg, and Zn, X is at least one element selected from the group consisting of F, Cl, Br, and I, and R is at least one element selected from the group consisting of Eu, Mn, and a combination of Eu and Mn).

The alkaline earth metal element boride halogen phosphors include $M_2B_5O_9X$:R (M is at least one element selected from the group consisting of Sr, Ca, Ba, Mg, and Zn, X is at least one element selected from the group consisting of F, Cl, Br, and I, and R is at least one element selected from the group consisting of Eu, Mn, and a combination of Eu and Mn).

The alkaline earth metal element aluminate phosphors include $SrAl_2O_4$:R, $Sr_4Al_{14}O_{25}$:R, $CaAl_2O_4$:R, $BaMg_2Al_{16}O_{27}$:R, and $BaMgAl_{10}O_{17}$:R(R is at least one element selected from the group consisting of Eu, Mn, and a combination of Eu and Mn).

The alkaline earth sulfide-based phosphors include, for example, $La_2O_2S$:Eu, $Y_2O_2S$:Eu, and $Gd_2O_2S$:Eu.

The rare earth aluminate phosphors mainly activated by a lanthanoid element, such as Ce, include YAG phosphors having the compositions of $Y_3Al_5O_{12}$:Ce, $(Y_{0.8}Gd_{0.2})_3Al_5O_{12}$:Ce, $Y_3(Al_{0.8}Ga_{0.2})_5O_{12}$:Ce, and $(Y, Gd)_3(Al, Ga)_5O_{12}$:Ce. The rare earth aluminate phosphors also include $Tb_3Al_5O_{12}$:Ce and $Lu_3Al_5O_{12}$:Ce in which a part or the whole of Y is substituted with, for example, Tb or Lu.

The alkaline earth element silicate phosphor may consist of silicate, and a representative example thereof is $(SrBa)_2SiO_4$:Eu.

Other phosphors include ZnS:Eu, $Zn_2GeO_4$:Mn, and $MGa_2S_4$:Eu (M is at least one element selected from the group consisting of Sr, Ca, Ba, Mg, and Zn, and X is at least one element selected from the group consisting of F, Cl, Br and I).

The above-mentioned phosphors may include at least one element selected from the group consisting of Tb, Cu, Ag, Au, Cr, Nd, Dy, Co, Ni, and Ti, instead of or in addition to Eu, if necessary.

Other phosphors having the same performance and effect as described above may also be used.

The second transparent resin 350 has a lens shape, and diffuses light emitted from the light-emitting element 1. It is possible to adjust the diffusion and emission characteristics of the second transparent resin by controlling the curvature and the flatness of the second transparent resin 350. The second transparent resin 350 is formed so as to surround the phosphor layer 340, and protects the phosphor layer 340. The reason is that, when the phosphor 344 contacts water, the characteristics thereof deteriorate.

The second transparent resin 350 may be formed of any material that can transmit light. For example, the second transparent resin 350 may be formed of an epoxy resin, a silicon resin, a hard silicon resin, a modified silicon resin, a urethane resin, an oxetane resin, an acrylic resin, a polycarbonate resin, or a polyimide resin.

Figure 14:
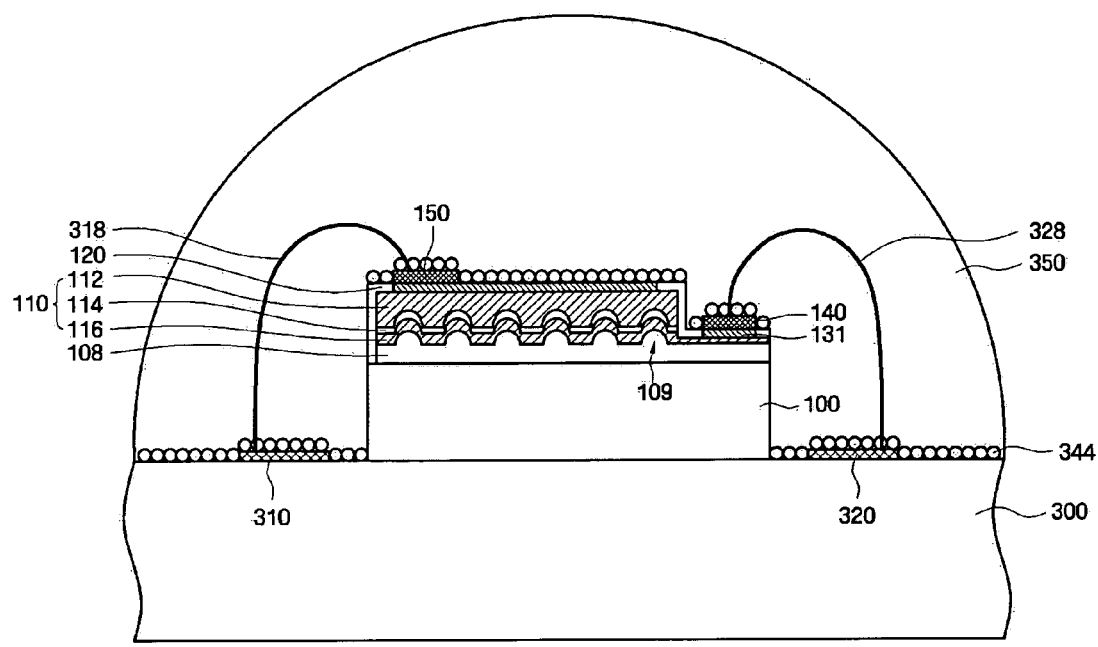
FIG. 14 is a diagram illustrating a light-emitting device according to the fourth embodiment of the present invention.

FIG. 14 is a diagram illustrating a light-emitting device according to the fourth embodiment of the present invention.

Referring to FIG. 14, the phosphor 344 is formed along the profiles of the light-emitting element 1 and the circuit board 300.

In this case, the phosphor 344 may be coated without a separate first transparent resin (see reference numeral 342 in FIG. 13).

When the phosphor 344 is coated without a separate first transparent resin, a single transparent resin layer surrounds the light-emitting element 1 (that is, a single layer 350 without the first transparent resin 342).

Figure 15:
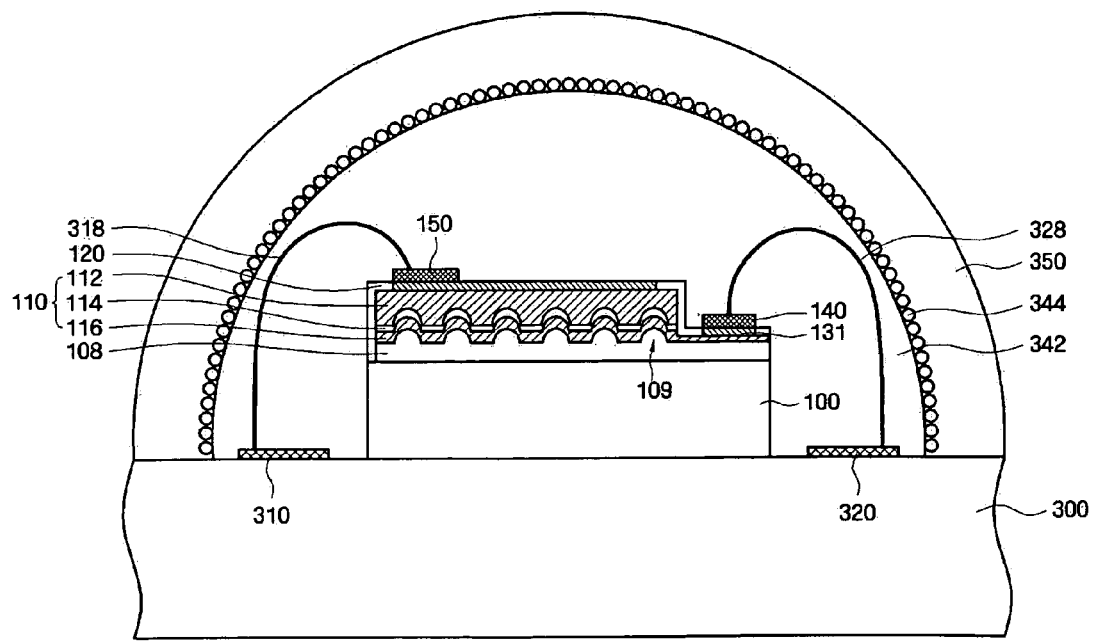
FIG. 15 is a diagram illustrating a light-emitting device according to the fifth embodiment of the present invention.

FIG. 15 is a diagram illustrating a light-emitting device according to the fifth embodiment of the present invention.

Referring to FIG. 15, the light-emitting device according to the fifth embodiment of the present invention differs from that according to the third embodiment in that it includes the first transparent resin 342 surrounding the light-emitting element 1, the phosphor 344 formed on the first transparent resin 342, and the second transparent resin 350 formed on the phosphor 344.

That is, since the first transparent resin 342 and the phosphor 344 are separately coated, the phosphor 344 is conformally formed with a small thickness along the surface of the first transparent resin 342.

Figure 16:
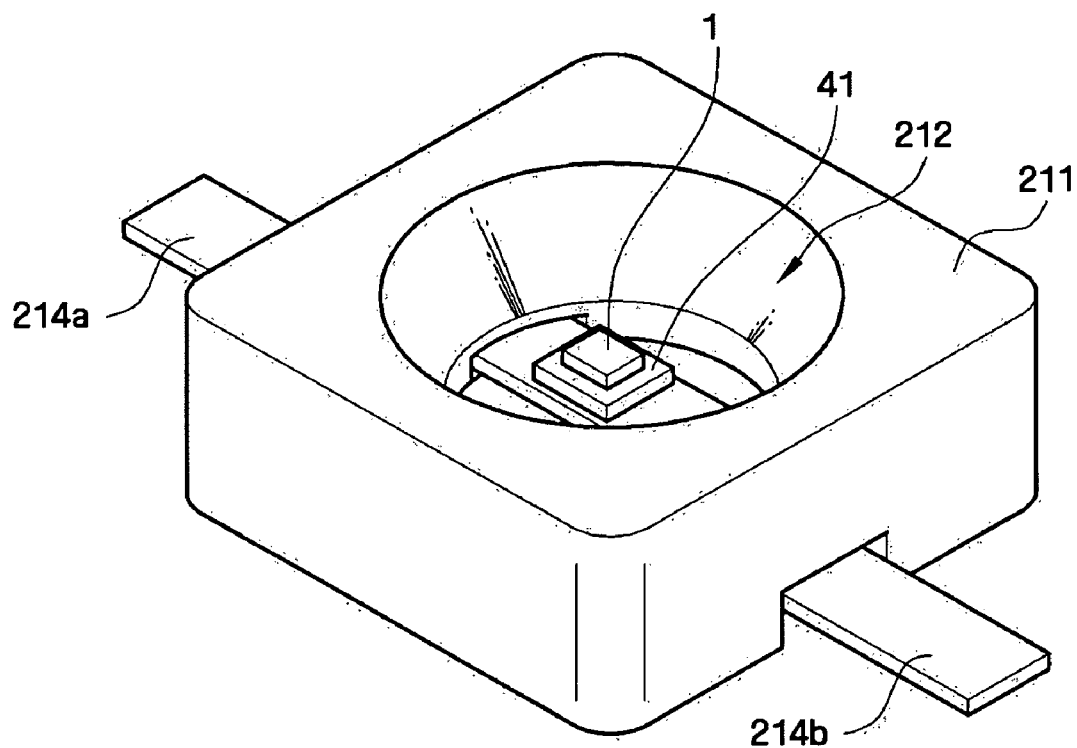
FIG. 16 is a diagram illustrating a light-emitting device according to the sixth embodiment of the present invention.

FIG. 16 is a diagram illustrating a light-emitting device according to the sixth embodiment of the present invention. The light-emitting device according to the sixth embodiment of the present invention is a top view type, but the present invention is not limited thereto.

Referring to FIG. 16, a sub-mount 41 having the light-emitting element 1 mounted thereon is provided on a package body 211. Specifically, the package body 211 may include a slot 212 formed therein, and the sub-mount 41 having the light-emitting element 1 mounted thereon may be provided in the slot 212. In particular, the side wall of the slot 212 may be inclined. Light emitted from the light-emitting element 1 may be reflected from the side wall and then travel forward. The size of the slot 212 may be determined in consideration of the amount of light which is emitted from the light-emitting element 1 and reflected from the side wall of the slot 212, the reflection angle thereof, the kind of transparent resin filling the slot 212, and the kind of phosphor. It is preferable that the sub-mount 41 be arranged at the center of the slot 212. When the distance between the light-emitting element 1 and the side wall is constant, it is easy to prevent color irregularity.

The package body 211 may be formed of an organic material having high light resistance, such as a silicon resin, an epoxy resin, an acrylic resin, a urea resin, a fluororesin, or an imide resin, or an inorganic material having high light resistance, such as glass or silica gel. In addition, the package body 211 may be formed of a heat-resistant resin such that it is not melt by heat during a manufacturing process. In addition, in order to reduce the thermal stress of resin, various fillers, such as aluminum nitride, aluminum oxide, and a compound thereof, may be mixed with the resin. The material forming the package body 211 is not limited to resin. A portion (for example, the side wall) of or the entire package body 211 may be formed of a metal material or a ceramic material. For example, when the entire package body 211 is formed of a metal material, it is easy to dissipate heat generated from the light-emitting element 1 to the outside.

In addition, leads 214a and 214b electrically connected to the light-emitting element 1 are provided in the package body 211. The light-emitting element 1 may be electrically connected to the sub-mount 41, and the sub-mount 41 and the leads 214a and 214b may be connected to each other by, for example, vias. The leads 214a and 214b may be formed of a material having high thermal conductivity in order to directly dissipate heat generated from the light-emitting element 1 to the outside through the leads 214a and 214b.

Although not shown in the drawings, at least a portion of the slot may be filled up with a transparent resin layer. A phosphor may be formed on the transparent resin layer. Alternatively, the transparent resin layer and the phosphor may be mixed with each other.

For example, the phosphor may be used as follows in order to emit white light. When the light-emitting element 1 emits blue light, the phosphor 344 may include a yellow phosphor, and it may also include a red phosphor in order to improve a color rendering index (CRI) characteristic. When the light-emitting element 1 emits UV light, the phosphor may include all of the red, green, and blue phosphors.

Figure 17:
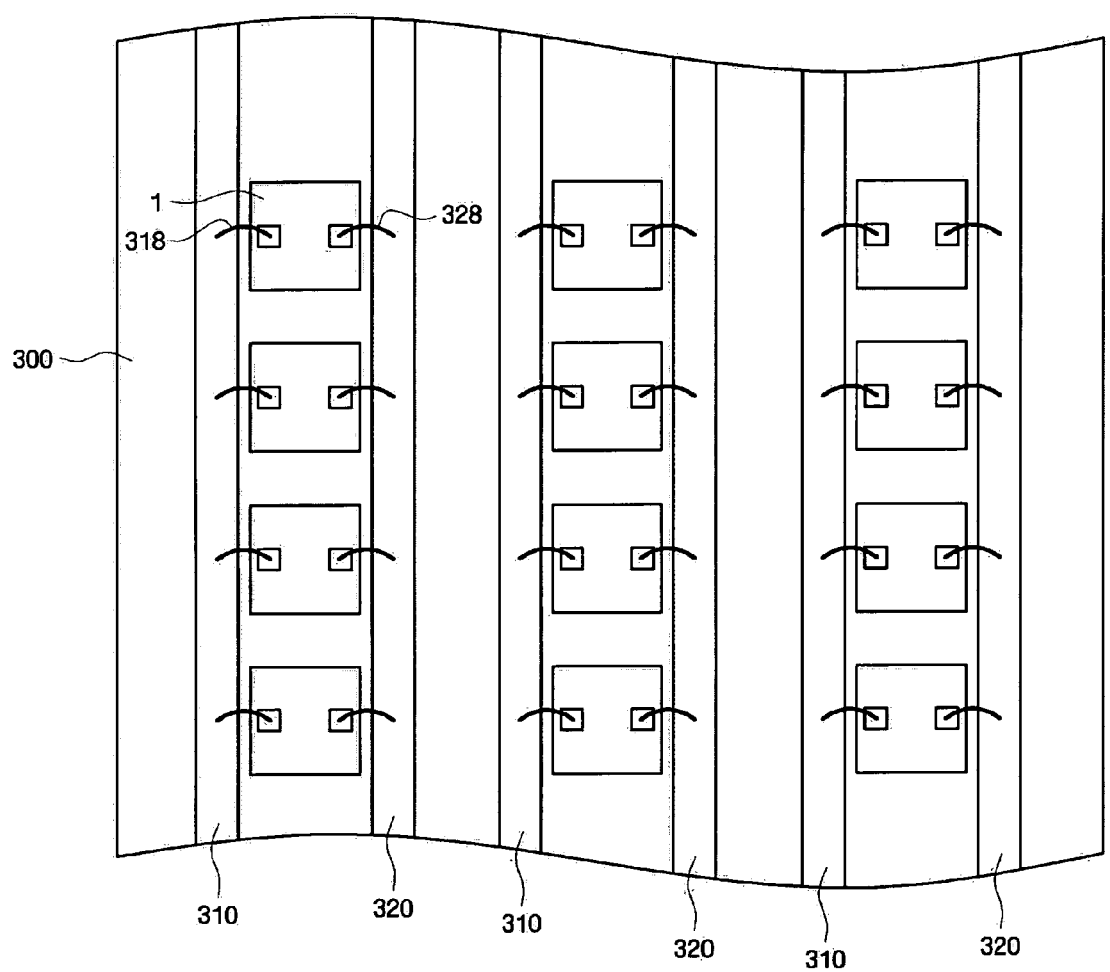
FIGS. 17 to 18B are diagrams illustrating a light-emitting device according to a seventh embodiment of the present invention.
Figure 18A:
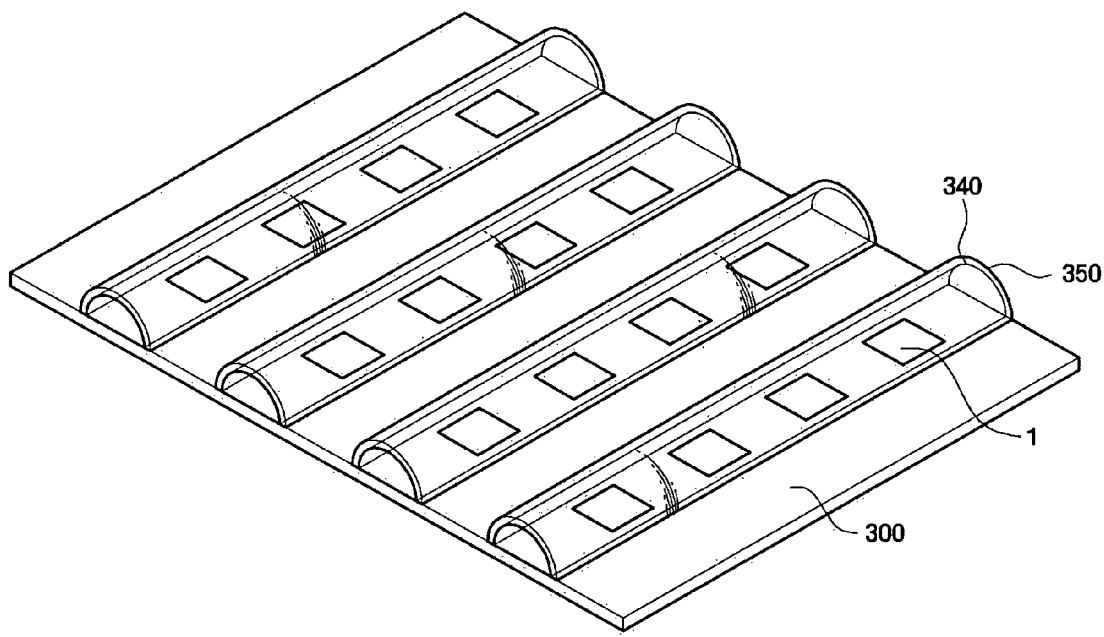
Figure 18B:
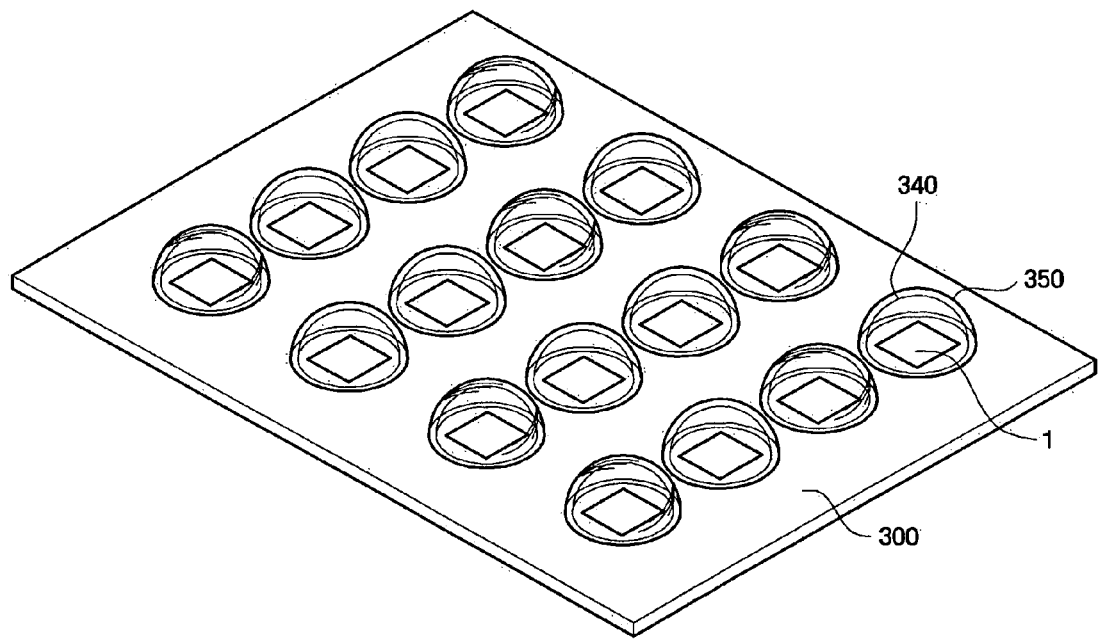

FIGS. 17 to 18B are diagrams illustrating a light-emitting device according to a seventh embodiment of the present invention. Specifically, FIGS. 17 to 18B are diagrams illustrating a light-emitting element array including a plurality of light-emitting elements arranged on a circuit board. Particularly, FIGS. 18A and 18B show examples of the arrangement of the phosphor layer 340 and the second transparent resin 350 formed on the light-emitting element array.

Referring to FIG. 17, the first wiring lines 310 and the second wiring lines 320 extend in one direction on the circuit board 300. The light-emitting elements 1 are arranged on the first wiring lines 310 in a line along the direction in which the first wiring line 310 extends.

When first and second biases are respectively applied to the first and second wiring lines 310 and 320 and a forward bias is applied to the light-emitting structure (not shown) in the light-emitting element 1, the light-emitting element 1 emits light.

Referring to FIG. 18A, the phosphor layer 340 and the second transparent resin 350 may be formed in linear shapes. For example, as shown in FIG. 17, when the light-emitting elements 1 are arranged in the direction in which the first wiring line 310 extends, the phosphor layer 340 and the second transparent resin 350 may also extend in the direction in which the first wiring line 310 extends. Alternatively, the phosphor layer 340 and the second transparent resin 350 may be formed so as to surround the first wiring line 310 and the second wiring line 320.

Referring to FIG. 18B, the phosphor layer 340 and the second transparent resin 350 may be formed in dot shapes. The phosphor layer 340 and the second transparent resin 350 may be formed so as to surround only the corresponding light-emitting element 1.

Figure 19:
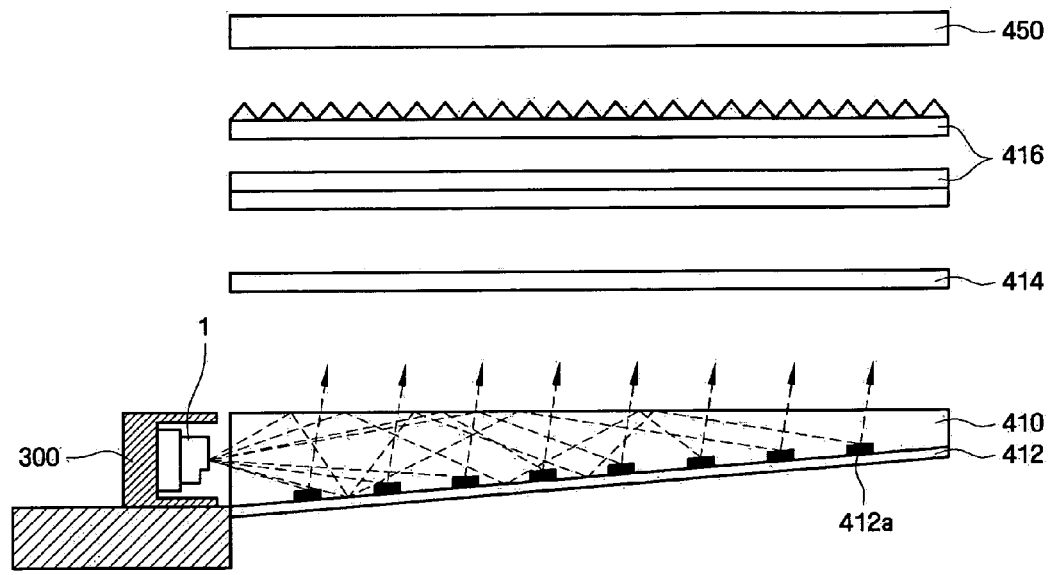
FIG. 19 is a diagram illustrating a light-emitting device according to an eighth embodiment of the present invention.

FIG. 19 is a diagram illustrating a light-emitting device according to an eighth embodiment of the present invention.

FIG. 19 shows an end product to which the light-emitting device according to the eighth embodiment of the present invention is applied. The light-emitting devices according to the above-described embodiments of the present invention may be applied to various apparatuses, such as illuminating devices, display devices, and mobile apparatuses (for example, a mobile phone, an MP3 player, and a navigation system). The device shown in FIG. 19 is an edge type backlight unit (BLU) used in a liquid crystal display (LCD). Since the liquid crystal display does not have a light source therein, the backlight unit is used as a light source, and the backlight unit illuminates the rear surface of a liquid crystal panel.

Referring to FIG. 19, the backlight unit includes the light-emitting element 1, a light guide plate 410, a reflecting plate 412, a diffusion sheet 414, and a pair of prism sheets 416.

The light-emitting element 1 emits light. The light-emitting element 1 may be a side view type.

The light guide plate 410 guides light to the liquid crystal panel 450. The light guide plate 410 is formed of a transparent plastic material, such as an acrylic resin, and guides light emitted from the light-emitting device to the liquid crystal panel 450 that is provided above the light guide plate 410. Therefore, various patterns 412a that change the traveling direction of light incident on the light guide plate 410 to the liquid crystal panel 450 are printed on the rear surface of the light guide plate 410.

The reflecting plate 412 is provided on the lower surface of the light guide plate 410 to reflect light emitted from the lower side of the light guide plate 410 to the upper side. The reflecting plate 412 reflects light that is not reflected by the patterns 412a, which are provided on the rear surface of the light guide plate 410, to the emission surface of the light guide plate 410. In this way, it is possible to reduce light loss and improve the uniformity of light emitted from the emission surface of the light guide plate 410.

The diffusion sheet 414 diffuses light emitted from the light guide plate 410 to prevent partial light concentration.

Trigonal prisms are formed on the upper surface of the prism sheet 416 in a predetermined array. In general, two prism sheets are arranged such that the prisms deviate from each other at a predetermined angle. In this way, the prism sheets make light diffused by the diffusion sheet 414 travel in a direction that is vertical to the liquid crystal panel 450.

FIGS. 20 to 23 are diagrams illustrating light-emitting devices according to ninth to twelfth embodiments of the present invention.

Figure 20:
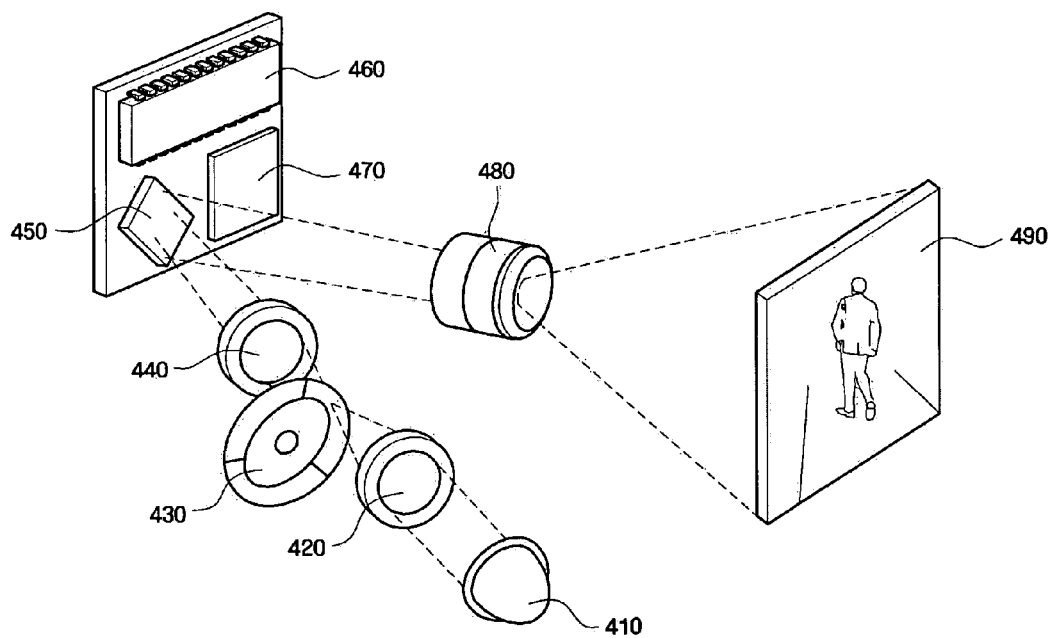
FIGS. 20 to 23 are diagrams illustrating light-emitting devices according to ninth to twelfth embodiments of the present invention.
Figure 21:
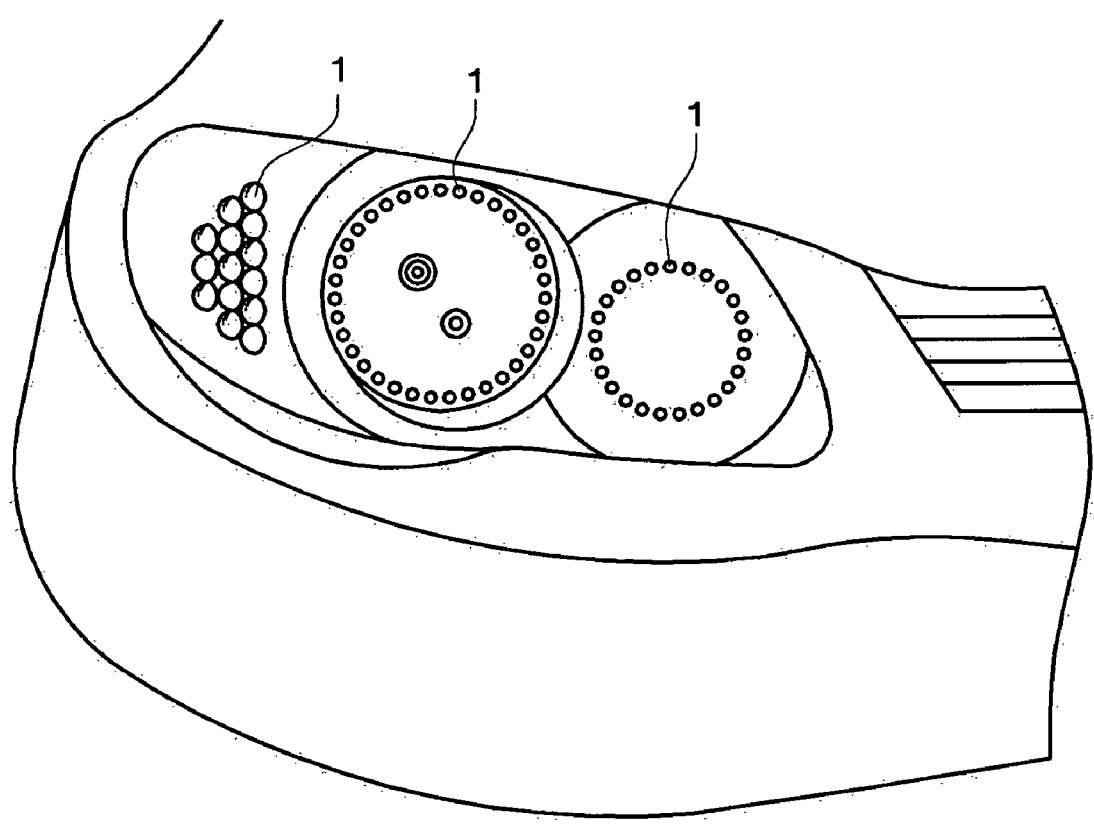
Figure 22:
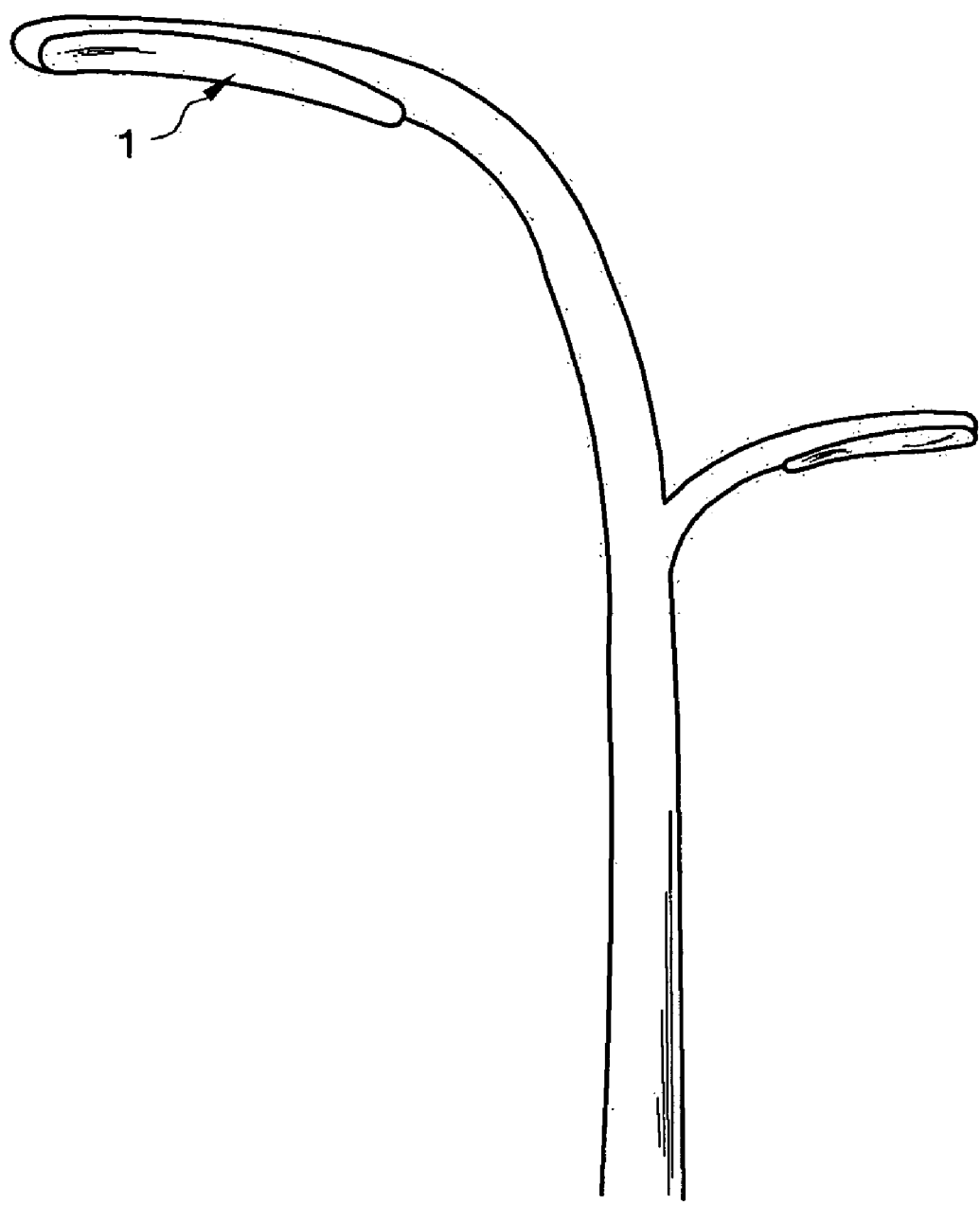
Figure 23:
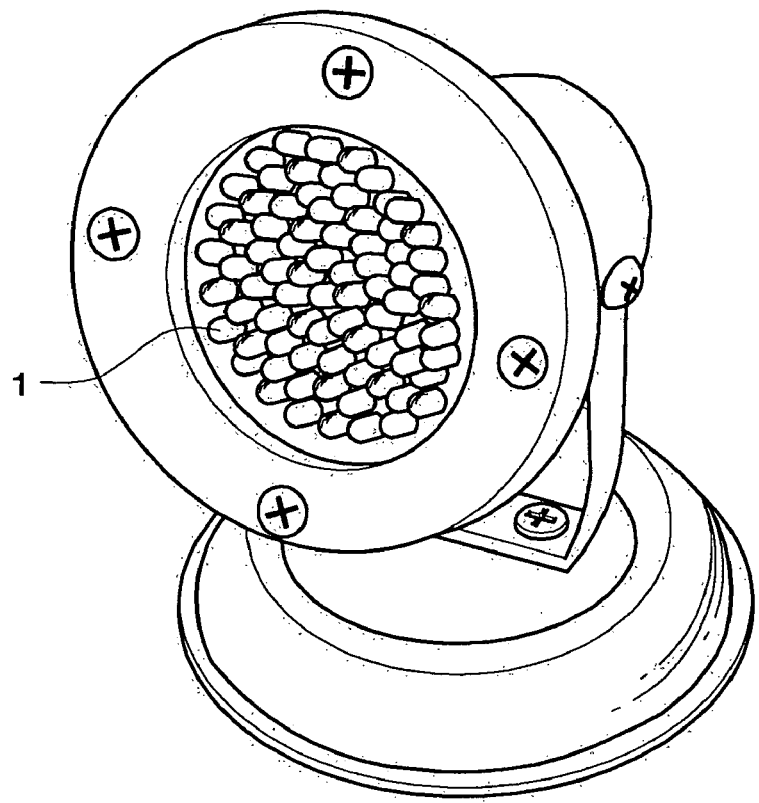

FIGS. 20 to 23 show end products to which the above-mentioned light-emitting device is applied. FIG. 20 shows a projector, FIG. 21 shows a car headlight, FIG. 22 shows a streetlamp, and FIG. 23 shows a lamp. The light-emitting element 1 used in FIGS. 20 to 23 may be a top view type.

Referring to FIG. 20, light emitted from a light source 410 passes through a condensing lens 420, a color filter 430, and a shaping lens 440 and is then reflected from a digital micromirror device (DMD) 450. Then, the light reaches a screen 490 through a projection lens 480. The light-emitting element according to the above-described embodiments of the present invention is provided in the light source 410.

Next, a method of manufacturing the light-emitting elements according to the above-described embodiments of the present invention will be described.

FIGS. 24 to 28 are diagrams illustrating intermediate steps of a method of manufacturing the light-emitting element according to the first embodiment of the present invention.

Figure 24:
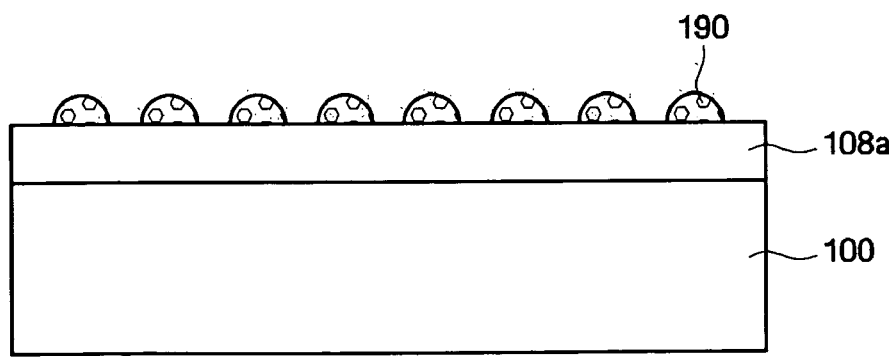
FIGS. 24 to 28 are diagrams illustrating intermediate steps of a method of manufacturing the light-emitting element according to the first embodiment of the present invention.

First, referring to FIG. 24, a buffer layer 108a is formed on the substrate 100.

Then, a mask pattern is formed on the buffer layer 108a, and a heat treatment is performed on the substrate 100 having the mask pattern formed thereon. At least a portion of the cross-section of the mask pattern 190 subjected to the heat treatment is curved.

Figure 25:
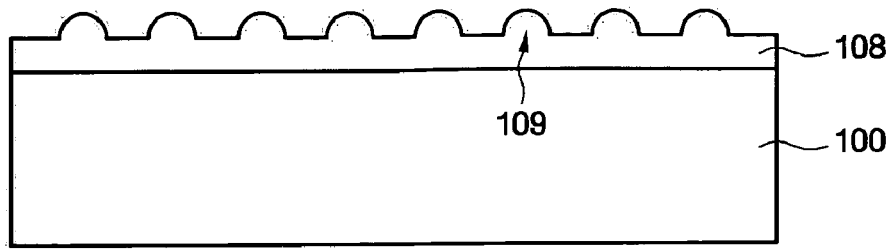

Referring to FIG. 25, the buffer layer 108a is etched by using the mask pattern 190 subjected to the heat treatment, thereby completing the buffer layer 108 having the uneven pattern 109 formed thereon. In this case, dry etching is performed on the buffer layer 108a, but the present invention is not limited thereto. For example, wet etching may be used.

Although not shown in the drawings, an insulating film including a silicon oxide film, a silicon nitride film, an aluminum oxide film, or an aluminum nitride film may be formed on the buffer layer 108a, and the mask pattern 190 may be formed on the insulating film. Then, a heat treatment may be performed on the mask pattern 190 such that a portion of the cross-section of the mask pattern 190 is curved, and the insulating film may be etched using the mask pattern 190 to form an uneven pattern on the insulating film. Then, the buffer layer 108a is etched using the insulating film having the uneven pattern formed thereon, thereby completing the buffer layer 108 having the uneven pattern 109 formed thereon.

Figure 26:
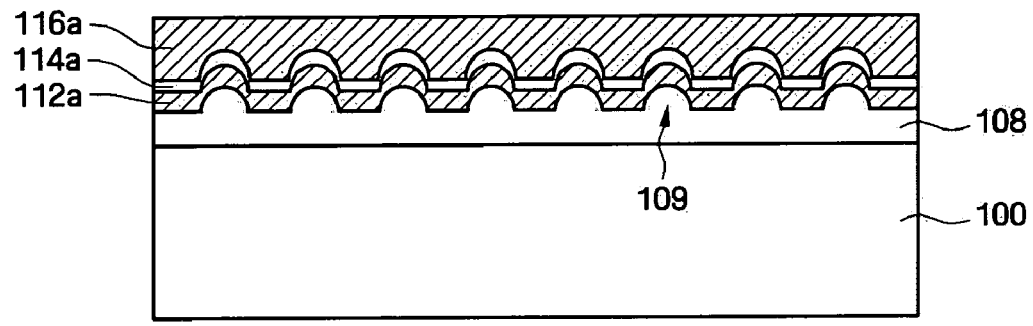

Referring to FIG. 26, a first conductive layer 112a of a first conductivity type is conformally formed along the buffer layer 108, and a light-emitting layer 114a is conformally formed along the first conductive layer 112a. Then, a second conductive layer 116 of a second conductivity type is formed on the light-emitting layer 114a.

The first conductive layer 112a, the light-emitting layer 114a, and the second conductive layer 116a may be grown by, for example, MOCVD (metal organic chemical vapor deposition), liquid phase epitaxy, hydride vapor phase epitaxy, molecular beam epitaxy, or MOVPE (metal organic vapor phase epitaxy).

Figure 27:
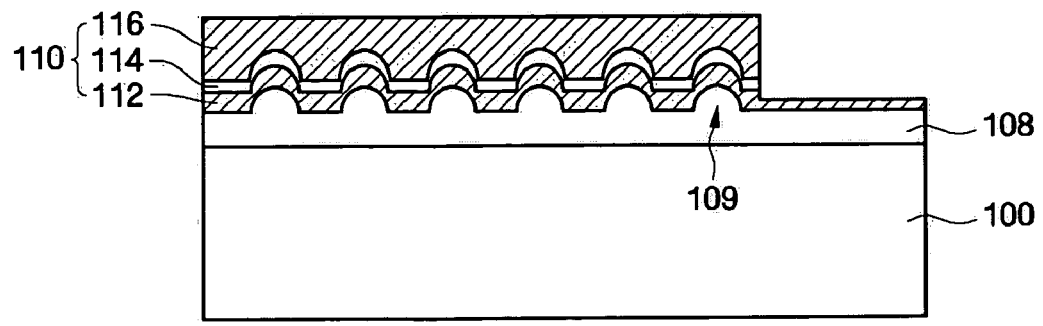

Referring to FIG. 27, the second conductive layer 116a, the light-emitting layer 114a, and the first conductive layer 112a are patterned to form the light-emitting structure 110 including the second conductive pattern 116, the light-emitting pattern 114, and the first conductive pattern 112.

In this case, the width of the first conductive pattern 112 is larger than that of the second conductive pattern 116 and the width of the light-emitting pattern 114, such that the first conductive pattern 112 protrudes from the second conductive pattern 116 and the light-emitting pattern 114 in the lateral direction.

Although not shown in the drawings, when the second conductive layer 116a, the light-emitting layer 114a, and the first conductive layer 112a are patterned, the light-emitting structure 110 may be formed such that the side wall thereof is inclined.

Figure 28:
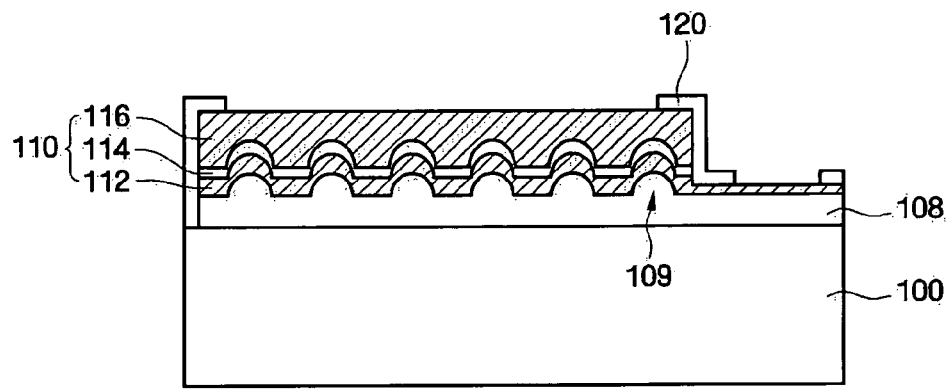

Referring to FIG. 28, the insulating layer 120 is formed on the light-emitting structure 110 including the second conductive pattern 116, the light-emitting pattern 114, and the first conductive pattern 112.

Then, the insulating layer 120 is patterned to expose a portion of the first conductive pattern 112 and a portion of the second conductive pattern 116.

Referring to FIG. 1 again, the first ohmic layer 131 and the first electrode 140 are formed on the first conductive pattern 112 exposed from the insulating layer 120, and the second ohmic layer 132 and the second electrode 150 are formed on the second conductive pattern 116 exposed from the insulating layer 120. In this way, the light-emitting element 1 according to the first embodiment of the present invention is completed.

FIGS. 29 to 33 are diagrams illustrating a method of manufacturing the light-emitting element according to the fifth embodiment of the present invention.

Figure 29:
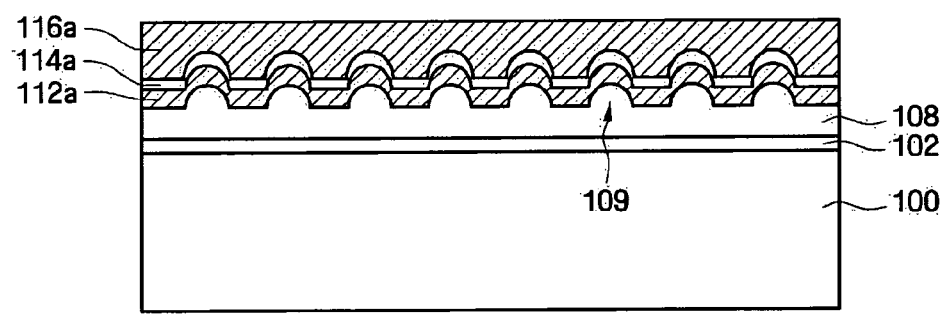
FIGS. 29 to 33 are diagrams illustrating intermediate steps of a method of manufacturing the light-emitting element according to the fifth embodiment of the present invention.

Referring to FIG. 29, a sacrificial layer 102 is formed on the substrate 100. Specifically, the sacrificial layer 102 is used to remove the substrate 100 using a laser lift-off (LLO) method, which will be described below. The sacrificial layer 102 may be, for example, a GaN layer.

Then, the buffer layer 108 having the uneven pattern 109 formed thereon is formed of the sacrificial layer 102. The first conductive layer 112a of a first conductivity type is conformally formed along the buffer layer 108 having the uneven pattern 109 formed thereon, and the light-emitting layer 114a is conformally formed on the first conductive layer 112a. Then, the second conductive layer 116a of a second conductivity type is formed on the light-emitting layer 114a.

Figure 30:
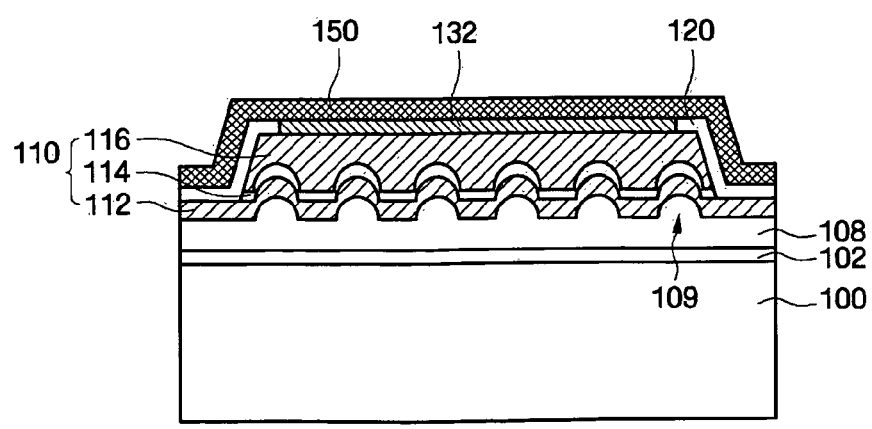

Referring to FIG. 30, the second conductive layer 116a, the light-emitting layer 114a, and the first conductive layer 112a are patterned to form the light-emitting structure 110 including the second conductive pattern 116, the light-emitting pattern 114, and the first conductive pattern 112. In this case, the light-emitting structure 110 is formed such that the side wall thereof is inclined.

Then, the insulating layer 120 is formed on the upper surface and the side wall of the light-emitting structure 110, and a portion of the insulating layer 120 is etched to expose a portion of the upper surface of the second conductive pattern 116.

Then, the second ohmic layer 132 is formed on the exposed second conductive pattern 116.

Then, the second electrode 150 is formed on the upper surface and the side wall of the light-emitting structure 110.

Figure 31:
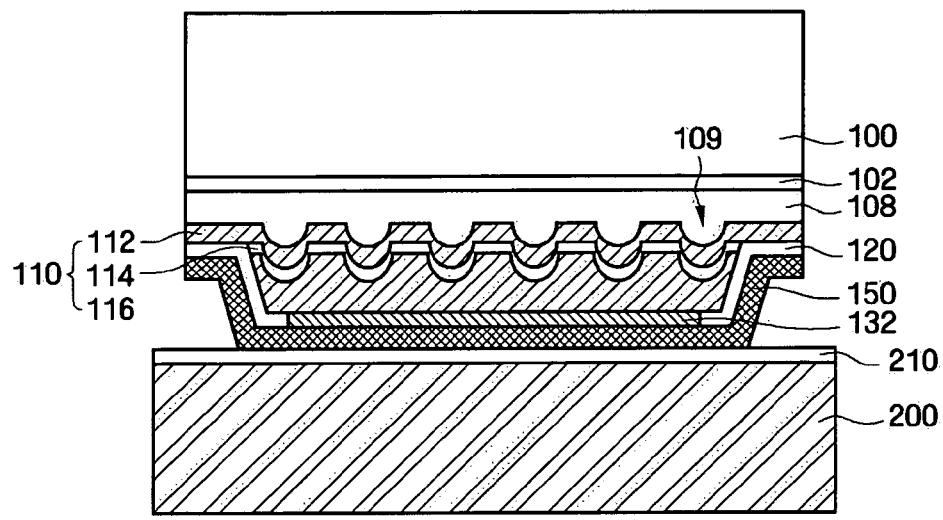

Referring to FIG. 31, the substrate 100 is bonded to the conductive substrate 200.

Specifically, the conductive substrate 200 may be formed of at least one of silicon, strained silicon (Si), silicon alloy, silicon aluminum (Si—Al), SOI (silicon-on-insulator), silicon carbide (SiC), silicon germanium (SiGe), silicon germanium carbide (SiGeC), germanium, germanium alloy, gallium arsenide (GaAs), indium arsenide (InAs), a group III-V semiconductor, and a group II-VI semiconductor.

It is preferable that the substrate 100 or the conductive substrate 200 be substantially flat. When the substrate 100 or the conductive substrate 200 is curved, it is difficult to bond the substrates. Since an intermediate material layer 210 is interposed between the substrate 100 and the conductive substrate 200 (particularly, when the intermediate material layer 210 has a sufficient thickness), the intermediate material layer 210 can compensate for the slight curvature of the substrate 100 or the conductive substrate 200, which will be described below.

For example, the conductive substrate 200 and a plurality of substrates 100 may be bonded to each other by adhesive bonding, which will be described in detail below.

First, the conductive substrate 200 and a plurality of substrates 100 are cleaned. It is preferable that the bonding surface of the conductive substrate 200 and the bonding surfaces of the substrates 100 be well cleaned. The reason is that various impurities adhered to the surfaces of the conductive substrate 200 and the substrates 100, such as particles and dust, may be a contamination source. That is, if there are impurities in an interface between the conductive substrate 200 and the substrates 100 during the bonding process therebetween, bonding energy may be weakened. When the bonding energy is weakened, the substrate 100 is likely to be easily detached from the conductive substrate 200.

Then, the intermediate material layer 210 is formed on the bonding surface of the conductive substrate 200 or the bonding surface of the substrate 100. In FIG. 31, for convenience of description, the intermediate material layer 210 is formed on the bonding surface of the conductive substrate 200. Although not shown in the drawings, another intermediate material layer 210 may be conformally formed along the profile of the second electrode 150 of the substrate 100, or the intermediate material layer 210 may be formed on the upper surface of the second electrode 150 of the light-emitting structure 110 and then bonded to the conductive substrate 200.

The intermediate material layer 210 may be formed of a conductive material. For example, the adhesive material layer 210 may be a metal layer. The metal layer may include at least one of Au, Ag, Pt, Ni, Cu, Sn, Al, Pb, Cr, and Ti. That is, the metal layer may be a single layer formed of Au, Ag, Pt, Ni, Cu, Sn, Al, Pb, Cr, or Ti, a laminate thereof, or a composition thereof. For example, the metal layer may be an Au layer, an Au—Sn layer, or a multilayer formed by alternately laminating Au and Sn layers. The intermediate material layer 210 may be formed of a material having a reflectance that is lower than that of the second electrode 150.

Although not shown in the drawings, a barrier layer may be formed between the second electrode 150 and the intermediate material layer 210. The barrier layer prevents the damage of the second electrode 150 that reflects light. The barrier layer may be a single layer made of Pt, Ni, Cu, Al, Cr, Ti, or W, a laminate thereof, or a composition thereof. For example, the barrier layer may be a multilayer formed by alternately laminating TiW and Pt layers.

Then, the second electrode 150 formed on the substrate 100 is arranged so as to face the bonding surface of the conductive substrate 200. That is, the second electrode 150 is arranged between the substrate 100 and the conductive substrate 200.

Then, a heat treatment is performed on the conductive substrate 200 and the substrate 100. While the heat treatment is performed, the conductive substrate 200 and the substrate 100 may be bonded to each other by compression.

When the intermediate material layer 210 is a single Au layer, thermocompression bonding may be performed at a temperature in the range of, for example, about 200° C. to 450° C. The temperature may be appropriately controlled by those skilled in the art.

Figure 32:
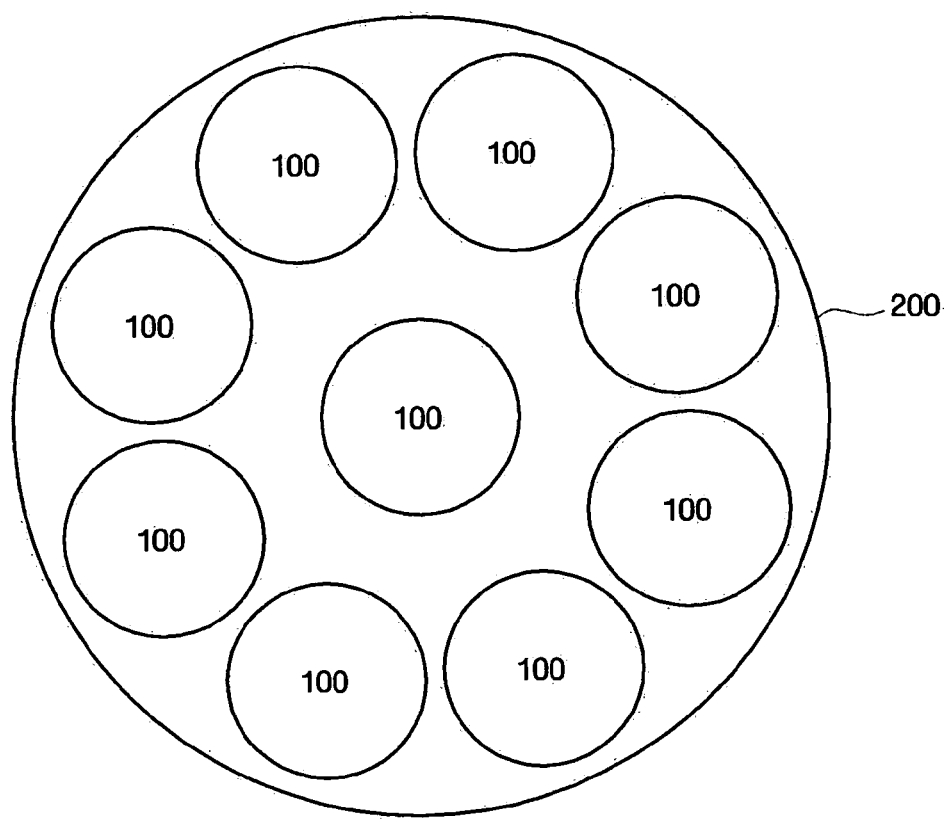
Figure 33:
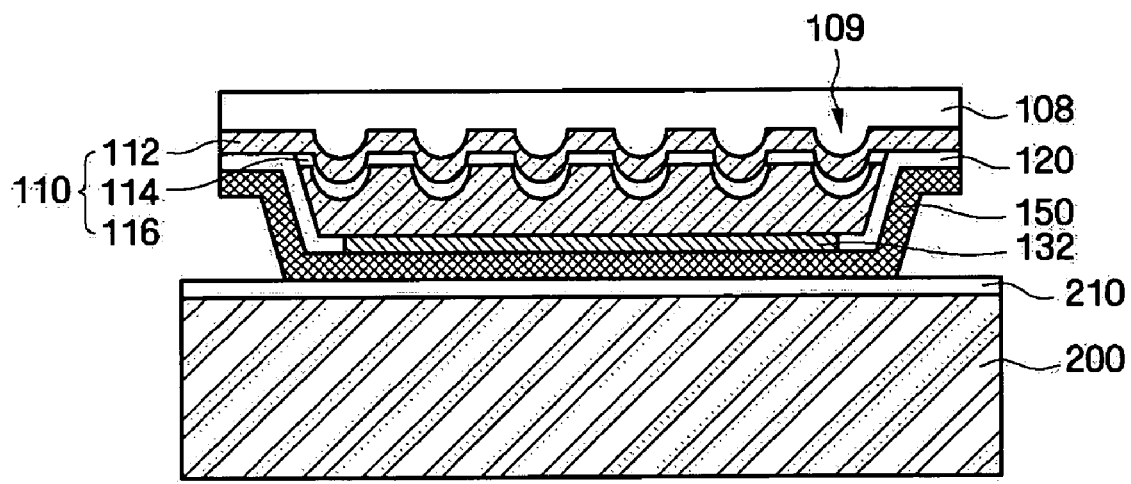

However, in order to improve throughput, as shown in FIG. 32, when the substrate 100 and the conductive substrate 200 are bonded to each other, a plurality of substrates 100 may be bonded to one conductive substrate 200.

Specifically, the conductive substrate 200 is larger than the substrate 100. That is, when the conductive substrate 200 and the substrate 100 overlap each other, the conductive substrate 200 covers the substrate 100 so as to conceal the substrate 100. For example, when the conductive substrate 200 and the substrate 100 have circular shapes, the diameter of the conductive substrate 200 is larger than that of the substrate 100. For example, the conductive substrate 200 may have a diameter of 6 inches or more (about 150 mm or more), and the substrate 100 may have a diameter of less than 6 inches. When the conductive substrate 200 and the substrate 100 have rectangular shapes, the diagonal of the conductive substrate 200 may be larger than that of the substrate 100. The second electrode 150 formed on each of the plurality of substrates 100 is arranged so as to face the conductive substrate 200.

Referring to FIG. 33 again, the sacrificial layer 102 is peeled off to remove the substrate 100.

Specifically, the substrate 100 may be removed by a laser lift-off (LLO) process or a chemical lift-off (CLO) process.

For example, the LLO process is performed as follows.

A laser beam is radiated to the substrate 100. Since the laser beam has a small spot, the substrate 100 is scanned by the laser beam. The laser beam is used to remove the sacrificial layer 102. Then, the substrate 100 is peeled off starting from a portion to which the laser beam is radiated.

In order to prevent the damage of the light-emitting element during the laser lift-off process, the thickness of the substrate 100 may be reduced before the LLO process. As described above, since the substrate 100 is peeled off starting from a portion to which the laser beam is radiated, the light-emitting structure 110 may be cracked or damaged due to physical force when the substrate 100 is peeled off. However, if the thickness of the substrate 100 is reduced in advance by, for example, a chemical mechanical polishing (CMP) process, the physical force when the substrate 100 is peeled off is weakened. Therefore, it is possible to prevent the damage of the light-emitting structure 110.

Referring to FIG. 8 again, the first electrode 140 is formed on the buffer layer 108. In this way, the light-emitting element 5 according to the fifth embodiment of the present invention is completed.

Specifically, a portion of the buffer layer 108 is etched such that the first conductive pattern 112 is exposed, and the first ohmic layer 131 is formed on the exposed region of the first conductive pattern 112. The first electrode 140 is formed on the first ohmic layer 131.

As described above, the buffer layer 108 may have a resistance that is larger than that of the first conductive pattern 112. The reason is that the first conductive pattern 112 is doped with a first conductive dopant, but the buffer layer 108 is undoped. The first ohmic layer 131 is formed between the first electrode 140 and the first conductive pattern 112 in order to transmit a voltage applied to the first electrode 140 to the first conductive pattern 112 with a small voltage drop.

A description of the methods of manufacturing the light-emitting elements according to the second to fourth embodiments will be omitted since those skilled in the art can infer the methods from the methods of manufacturing the light-emitting elements according to the first and fifth embodiments of the present invention. In addition, a description of a method of manufacturing light-emitting devices using the light-emitting elements will be omitted since those skilled in the art can infer the method from the above.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A light-emitting element comprising:
a buffer layer having an uneven pattern formed thereon;
a light-emitting structure including a first conductive pattern of a first conductivity type that is conformally formed along the buffer layer having the uneven pattern formed thereon, a light-emitting pattern that is conformally formed along the first conductive pattern, and a second conductive pattern of a second conductivity type that is formed on the light-emitting pattern;
a first electrode electrically connected to the first conductive pattern; and
a second electrode electrically connected to the second conductive pattern.

2. The light-emitting element of claim 1, wherein at least a portion of the cross-section of the uneven pattern is curved.

3. The light-emitting element of claim 2, wherein the uneven pattern has a semicircular shape in a cross-sectional view.

4. The light-emitting element of claim 1, wherein the uneven pattern includes a plurality of periodic patterns.

5. The light-emitting element of claim 1, wherein the uneven pattern is at least one of a dot pattern, a line pattern, and a mesh pattern.

6. The light-emitting element of claim 1, wherein the second conductive pattern is conformally formed along the light-emitting pattern.

7. The light-emitting element of claim 1, wherein the second conductive pattern has a flat upper surface.

8. The light-emitting element of claim 1, wherein the side wall of the light-emitting structure is inclined.

9. The light-emitting element of claim 1, wherein the width of the first conductive pattern is larger than that of the second conductive pattern and the light-emitting pattern such that a portion of the first conductive pattern protrudes from the second conductive pattern and the light-emitting pattern in a lateral direction.

10. The light-emitting element of claim 9, wherein the first electrode is formed on a protruding portion of the first conductive pattern, and the second electrode is formed on the upper surface and/or the side wall of the light-emitting structure.

11. The light-emitting element of claim 1, wherein the second electrode is a reflecting electrode, and the second electrode is formed on the upper surface and the side wall of the light-emitting structure.

12. A light-emitting element comprising:
a conductive substrate;
a first electrode having a bowl shape and formed on the conductive substrate;

a light-emitting structure including a first conductive pattern of a first conductivity type, a light-emitting pattern, and a second conductive pattern of a second conductivity type sequentially formed in the first electrode;

a buffer layer formed on the light-emitting structure; and a second electrode formed on the buffer layer, wherein an uneven pattern is formed on the buffer layer, the second conductive pattern is conformally formed along the buffer layer, and the light-emitting pattern is conformally formed along the second conductive pattern.

13. The light-emitting element of claim 12, wherein at least a portion of the cross-section of the uneven pattern is curved.

14. The light-emitting element of claim 12, wherein the buffer layer is formed such that a portion of the second conductive pattern is exposed, an ohmic layer is formed on the exposed region of the second conductive pattern, and the second electrode is formed on the ohmic layer.

15. The light-emitting element of claim 12, wherein the bowl-shaped first electrode includes a protrusion that protrudes from the lower side thereof, the light-emitting structure is divided into two sides by the protrusion, and the second electrode is formed on one side of the light-emitting structure.

16. A light-emitting device comprising the light-emitting element according to claim 1.

17. A light emitting element comprising:

a substrate; a light emitting structure on the substrate, wherein the light emitting structure comprises:

a first conductive layer of P-type material comprising AlGaN;

a light emitting layer on the first conductive layer, wherein the light emitting layer comprises a multiple quantum well structure; and a second conductive layer of N-type material on the light emitting layer, wherein the second conductive layer has an uneven surface pattern thereon and wherein the second conductive layer comprises InGaN;

an insulating layer between the substrate and the first conductive layer, said insulating layer having at least one opening therethrough, wherein first and second biases are respectively applied to the first and second conductive layers through the at least one opening;

a first metal layer electrically connected through the at least one opening to the first conductive layer, wherein the first metal layer comprises an Ag layer and an Au layer; and a second metal layer electrically connected through the at least one opening to the second conductive layer, wherein the second metal layer comprises Al and Au.

18. The light emitting element of claim 17, wherein the insulating layer comprises silicon nitride.

19. The light emitting element of claim 18, further comprising a phosphor layer.

20. The light emitting element of claim 19, further comprising a first transparent resin layer surrounding the phosphor layer.

21. The light emitting element of claim 20, wherein the first transparent resin layer comprises a silicon resin.

22. The light emitting element of claim 21, further comprising a second transparent resin layer surrounding the first transparent resin layer.

23. The light emitting element of claim 22, wherein the second transparent resin layer has a lens shape.

24. The light emitting element of claim 23, wherein the second transparent resin layer comprises a silicon resin.

25. The light emitting element of claim 17, wherein the light emitting element is of a flip-chip type.

* * * * *